US006880130B2

(12) United States Patent
Makowski et al.

(10) Patent No.: US 6,880,130 B2
(45) Date of Patent: Apr. 12, 2005

(54) SPECIFYING TIMING AND TRIGGERING FUNCTIONALITY IN A GRAPHICAL PROGRAM USING GRAPHICAL PROGRAM NODES

(75) Inventors: Thomas A. Makowski, Austin, TX (US); Rajesh Vaidya, Austin, TX (US); Brian Johnson, Austin, TX (US)

(73) Assignee: National Instruments Corporation, Austin, TX (US)

( * ) Notice: Subject to any disclaimer, the term of this patent is extended or adjusted under 35 U.S.C. 154(b) by 306 days.

(21) Appl. No.: 10/179,149

(22) Filed: Jun. 24, 2002

(65) Prior Publication Data

US 2003/0234802 A1 Dec. 25, 2003

(51) Int. Cl.[7] .............................. G06F 3/00; G66F 19/00
(52) U.S. Cl. ....................... 715/763; 715/771; 715/835; 715/837; 715/843; 715/967; 717/105; 717/109
(58) Field of Search ................................. 715/734, 735, 715/763, 764, 765, 771, 835, 837, 841, 843, 846, 967; 717/105, 109, 114, 116; 345/734, 735, 763–765, 771, 835, 837, 841, 843, 846

(56) References Cited

U.S. PATENT DOCUMENTS

| | | | |
|---|---|---|---|
| 5,301,301 A | | 4/1994 | Kodosky et al. ............... 716/11 |
| 5,392,207 A | * | 2/1995 | Wilson et al. .................. 700/64 |
| 5,485,600 A | | 1/1996 | Joseph et al. ................... 703/13 |
| 5,680,639 A | * | 10/1997 | Milne et al. .............. 715/500.1 |
| 5,821,934 A | * | 10/1998 | Kodosky et al. ............. 345/763 |
| 5,850,548 A | | 12/1998 | Williams ...................... 717/107 |
| 5,995,916 A | | 11/1999 | Nixon et al. ................. 702/182 |
| 6,055,369 A | * | 4/2000 | Sawahata et al. ........... 717/109 |
| 6,216,138 B1 | | 4/2001 | Wells et al. ................. 715/502 |
| 6,292,810 B1 | | 9/2001 | Richards ...................... 715/503 |
| 6,366,300 B1 | | 4/2002 | Ohara et al. ................. 345/771 |
| 6,437,805 B1 | | 8/2002 | Sojoodi et al. .............. 345/763 |
| 6,708,135 B2 | * | 3/2004 | Southworth et al. ........ 702/176 |

OTHER PUBLICATIONS

International Search Report, Application No. PCT/US03/19865, MAILED Sep. 12, 2003.

* cited by examiner

*Primary Examiner*—X. L. Bautista
(74) *Attorney, Agent, or Firm*—Meyertons Hood Kivlin Kowert & Goetzel, P.C.; Jeffrey C. Hood; Mark S. Williams

(57) ABSTRACT

System and method for specifying timing or triggering (TT) in a graphical program (GP). A first polymorphic timing or triggering node (PTTN) is displayed in the GP in response to user input. TT type options for the PTTN are presented in response to user input. User input specifying one of the TT type options is received, and a second TT node (TTN) determined in response which corresponds to the specified type, and which provides TT functionality for the graphical program according to the type. The second TTN replaces the first PTTN in the GP, and connects to function nodes in the GP to provide TT functionality in the GP according to the type. The TTN includes a front panel with controls and/or indicators for interactively setting and/or displaying parameters according to the type, and a block diagram graphically representing the implementation of TT functionality according to the type.

96 Claims, 26 Drawing Sheets

SPECIFYING TIMING AND TRIGGERING FUNCTIONALITY IN A GRAPHICAL PROGRAM USING GRAPHICAL PROGRAM NODES

FIELD OF THE INVENTION

The present invention relates to graphical programming, and in particular to a system and method for specifying timing and triggering functionality in a graphical program using graphical program nodes.

DESCRIPTION OF THE RELATED ART

Traditionally, high level text-based programming languages have been used by programmers in writing application programs. Many different high level programming languages exist, including BASIC, C, Java, FORTRAN, Pascal, COBOL, ADA, APL, etc. Programs written in these high level languages are translated to the machine language level by translators known as compilers or interpreters. The high level programming languages in this level, as well as the assembly language level, are referred to herein as text-based programming environments.

Increasingly, computers are required to be used and programmed by those who are not highly trained in computer programming techniques. When traditional text-based programming environments are used, the user's programming skills and ability to interact with the computer system often become a limiting factor in the achievement of optimal utilization of the computer system.

There are numerous subtle complexities which a user must master before he can efficiently program a computer system in a text-based environment. The task of programming a computer system to model or implement a process often is further complicated by the fact that a sequence of mathematical formulas, steps or other procedures customarily used to conceptually model a process often does not closely correspond to the traditional text-based programming techniques used to program a computer system to model such a process. In other words, the requirement that a user program in a text-based programming environment places a level of abstraction between the user's conceptualization of the solution and the implementation of a method that accomplishes this solution in a computer program. Thus, a user often must substantially master different skills in order to both conceptualize a problem or process and then to program a computer to implement a solution to the problem or process. Since a user often is not fully proficient in techniques for programming a computer system in a text-based environment to implement his solution, the efficiency with which the computer system can be utilized often is reduced.

Examples of fields in which computer systems are employed to interact with physical systems are the fields of instrumentation, process control, industrial automation, and simulation. Computer measurement and control of devices such as instruments or industrial automation hardware has become increasingly desirable in view of the increasing complexity and variety of instruments and devices available for use. However, due to the wide variety of possible testing and control situations and environments, and also the wide array of instruments or devices available, it is often necessary for a user to develop a custom program to control a desired system.

As discussed above, computer programs used to control such systems traditionally had to be written in text-based programming languages such as, for example, assembly language, C, FORTRAN, BASIC, etc. Traditional users of these systems, however, often were not highly trained in programming techniques and, in addition, text-based programming languages were not sufficiently intuitive to allow users to use these languages without training. Therefore, implementation of such systems frequently required the involvement of a programmer to write software for control and analysis of instrumentation or industrial automation data. Thus, development and maintenance of the software elements in these systems often proved to be difficult.

U.S. Pat. Nos. 4,901,221; 4,914,568; 5,291,587; 5,301,301; and 5,301,336; among others, to Kodosky et al disclose a graphical system and method for modeling a process, i.e., a graphical programming environment which enables a user to easily and intuitively model a process. The graphical programming environment disclosed in Kodosky et al can be considered a higher and more intuitive way in which to interact with a computer. A graphically based programming environment can be represented at a level above text-based high level programming languages such as C, Basic, Java, etc.

The method disclosed in Kodosky et al allows a user to construct a diagram using a block diagram editor. The block diagram may include a plurality of interconnected icons such that the diagram created graphically displays a procedure or method for accomplishing a certain result, such as manipulating one or more input variables and/or producing one or more output variables. In response to the user constructing a diagram or graphical program using the block diagram editor, data structures and/or program instructions may be automatically constructed which characterize an execution procedure that corresponds to the displayed procedure. The graphical program may be compiled or interpreted by a computer.

Therefore, Kodosky et al teaches a graphical programming environment wherein a user places or manipulates icons and interconnects or "wires up" the icons in a block diagram using a block diagram editor to create a graphical "program." A graphical program for performing an instrumentation, measurement or automation function, such as measuring a Unit Under Test (UUT) or device, controlling or modeling instruments, controlling or measuring a system or process, or for modeling or simulating devices, may be referred to as a virtual instrument (VI). Thus, a user can create a computer program solely by using a graphically based programming environment. This graphically based programming environment may be used for creating virtual instrumentation systems, modeling processes, control, simulation, and numerical analysis, as well as for any type of general programming.

A graphical program may have a graphical user interface. For example, in creating a graphical program, a user may create a front panel or user interface panel. The front panel may include various graphical user interface elements or front panel objects, such as user interface controls and/or indicators, that represent or display the respective input and output that will be used by the graphical program or VI, and may include other icons which represent devices being controlled. The front panel may be comprised in a single window of user interface elements, or may comprise a plurality of individual windows each having one or more user interface elements, wherein the individual windows may optionally be tiled together. When the controls and indicators are created in the front panel, corresponding icons or terminals may be automatically created in the block diagram by the block diagram editor. Alternatively, the user can place terminal icons in the block diagram which may cause the display of corresponding front panel objects in the front panel, either at edit time or later at run time. As another example, the front panel may comprise front panel objects, e.g., the GUI, embedded in the block diagram.

During creation of the block diagram portion of the graphical program, the user may select various function nodes or icons that accomplish his desired result and connect the function nodes together. For example, the function nodes may be connected in one or more of a data flow, control flow, and/or execution flow format. The function nodes may also be connected in a "signal flow" format, which is a subset of data flow. The function nodes may be connected between the terminals of the various user interface elements, e.g., between the respective controls and indicators. Thus the user may create or assemble a graphical program, referred to as a block diagram, graphically representing the desired process. The assembled graphical program may be represented in the memory of the computer system as data structures and/or program instructions. The assembled graphical program, i.e., these data structures, may then be compiled or interpreted to produce machine language that accomplishes the desired method or process as shown in the block diagram.

Input data to a graphical program may be received from any of various sources, such as from a device, unit under test, a process being measured or controlled, another computer program, or from a file. Also, a user may input data to a graphical program or virtual instrument using a graphical user interface, e.g., a front panel as described above. The input data may propagate through the data flow block diagram or graphical program and appear as changes on the output indicators. In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators. Alternatively, the front panel may be used merely to view the input and output, or just the output, and the input may not be interactively manipulable by the user during program execution.

Thus, graphical programming has become a powerful tool available to programmers. Graphical programming environments such as the National Instruments LabVIEW product have become very popular. Tools such as LabVIEW have greatly increased the productivity of programmers, and increasing numbers of programmers are using graphical programming environments to develop their software applications. In particular, graphical programming tools are being used for test and measurement, data acquisition, process control, man machine interface (MMI), supervisory control and data acquisition (SCADA) applications, simulation, image processing/machine vision applications, and motion control, among others.

In many applications, such as data acquisition and signal generation, specifying a task generally includes specifying timing and triggering for the task. More specifically, timing and triggering nodes may be included in a graphical program which provide parameters that respectively configure timing and triggering for the task. In other words, the nodes provide one or more parameters which configure timing and triggering for data acquisition and/or signal generation devices in the measurement system, e.g., at or during execution of the graphical program.

However, due to the fact that there are many different possible ways to perform timing and triggering for a task, and each way entails the use of a particular set of parameters, the number and type of parameters which may conceivably be applicable to the timing and/or triggering for the task may be quite large, and may be overwhelming to the user.

For example, in one approach to specifying timing and triggering for a task, a different VI or node for each possible timing or triggering type may be provided to the user, e.g., in a palette or menu. However, the large number of resulting VIs/nodes would greatly complicate navigation or use of the palette, and in addition, switching the type of timing or triggering would require that the user manually replace the original VI/node in the graphical program with a different VI/node of the correct type, requiring further time and effort.

Another approach to timing and triggering used in some prior art systems uses a respective timing or triggering VI or node with all configuration parameters for all possible types of timing or triggering. In other words, the timing node includes parameters for all possible timing types, where only the parameters which apply to the particular timing type for the task would actually be used. Similarly, the trigger node includes all possible trigger parameters. Unfortunately, this approach places an unreasonable burden on the user, in that the user is required to determine just which of the many parameters to set for the task. The presence of many parameters which are not used is likely to be confusing to the user, and may increase the occurrence of errors.

FIGS. 4A–4E illustrate just such a prior art system, where timing and triggering configuration nodes include supersets of timing and triggering parameters, respectively. FIG. 4A is a graphical program, also referred to as a block diagram, for a typical data acquisition program, with a read node for acquiring data from a data acquisition device, and nodes for configuring timing and triggering, as well as control and group configuration. FIG. 4B is a front panel for the timing node. As FIG. 4B shows, more than twenty parameters are presented on the panel, although only a subset of the parameters are applicable to the task at hand. FIG. 4C is a block diagram of the timing node, and, as may be seen, includes all of the parameters presented by the front panel of FIG. 4B. The complexity resulting from the inclusion of all possible parameters can be confusing to the user, and may thus limit the usability of the system. Similarly, FIGS. 4D and 4E illustrate a front panel and block diagram, respectively, for the triggering node in the graphical program of FIG. 4A, according to the prior art. As FIGS. 4D and 4E also show, the inclusion of extraneous parameters unnecessarily clutters the front panel and block diagram, making their use more difficult. Additionally, many of the parameters are actually mutually exclusive, i.e., cannot be used at the same time. The interface thus makes it difficult for the user to determine which parameters they need to supply or specify for the task.

Therefore, improved means for specifying timing and triggering for a task are desired.

SUMMARY OF THE INVENTION

Various embodiments of a system and method are presented for specifying timing and triggering in a graphical program using graphical program nodes. The system may include a computer system comprising a processor, memory, display, and input device. The system may be operable to store and execute program instructions according to an embodiment of the present invention, including, for example, a graphical programming development environment whereby a user may create a graphical program to perform a task, such as a measurement task. The system may also include one or more devices, e.g., measurement devices, for use in conjunction with the graphical program to perform the task, as well as programs and/or data. The graphical program may include one or more graphical program elements, such as property nodes, palettes, and menus, which may be used to configure the graphical program, for example, by setting/getting parameters for graphical controls, programs, and/or devices of the system. Thus, the system may include various resources, including hardware, software, and/or data, for use by the system in performing a task.

The computer-implemented method, as described below, may be applied to timing and/or triggering nodes in the graphical program, but for brevity is described for timing specification only. The method as described also applies to triggering specification for the graphical program.

First, the graphical program may optionally be created on the computer system (or on a different computer system), comprising a plurality of interconnected nodes or icons which visually indicates the functionality of the program. The graphical program may include a block diagram and may also include a user interface portion or front panel portion. As one example, the user may use the LabVIEW graphical programming development environment to create the graphical program. The graphical program may implement a measurement function that is desired to be performed by an instrument, e.g., in an application where the instrument is an image acquisition device (e.g., smart camera), the graphical program may implement an image processing function.

In one embodiment, a first timing node may be displayed in the graphical program, e.g., on a display of the computer, e.g., in response to user input, such as the user dragging and dropping the first timing node from a palette to the graphical program. A plurality of timing type options for the first timing node may be displayed on the display. In one embodiment, the timing type options may be presented in response to user input. For example, the user may right-click on the first timing node, and a graphical user interface, e.g., a menu, may be presented showing the available timing type options. In one embodiment, the first timing node may be connected (e.g., in response to user input) to one or more function nodes in the graphical program prior to displaying the plurality of timing type options, where the first timing node is then operable to configure timing functionality for the one or more function nodes.

In response to the display of the timing type options, user input may be received specifying a timing type from the plurality of timing type options: For example, the user may select the timing type from the plurality of timing type options by double-clicking on a menu item.

Then, a second timing node may be determined based on the user input specifying the timing type, and the second timing node may be displayed in place of the first timing node. The second timing node may be operable to configure timing functionality for the graphical program in accordance with the timing type. If the first timing node has not already been connected to other nodes in the program, then, as described above, user input to the graphical program may be received connecting the second timing node to the one or more function nodes in the graphical program, e.g., by "wiring" the nodes together. During execution of the graphical program, the second timing node may then configure timing functionality for the one or more function nodes.

In one embodiment, the first timing node, and optionally, the second timing node, may be polymorphic. As used herein, the term "polymorphic" refers to nodes which share a name and/or an icon, but which have different functionality. Generally, the particular functionality required for the node is determined based upon the inputs and/or outputs of the node, i.e., upon the timing type specified or selected for the node. Thus, the polymorphic timing node may share a name and/or an icon with one or more other timing nodes, or timing node functionalities, where, depending upon the selected timing type, the underlying functionality of the node may be modified, configured, or exchanged in accordance with the selected timing type.

The second timing node may include an icon, which is used to display the second timing node in the graphical program, and may also include a block diagram, e.g., a graphical representation of the implementation of timing configuration, in accordance with the specified timing type. In addition to the block diagram, the second timing node may also include a front panel or other graphical user interface (GUI), which may include one or more controls and/or indicators for interactively setting and displaying one or more timing parameters during graphical program execution in accordance with the specified timing type. The front panel may be displayed on the display of the computer, and user input may be received by the front panel specifying a value for at least one of the one or more timing parameters. The second timing node may then be operable to configure timing functionality in the graphical program in accordance with the one or more timing parameters. The block diagram may similarly be displayed on the display, thus illustrating to the user the underlying functionality of the second timing node.

In another embodiment, in addition to the second timing node icon, the second timing node may include program instructions and/or data structures for implementing timing configuration in accordance with the specified timing type, e.g., program instructions and/or data structures in a text-based programming language such as C or C++ (or any other programming language) which is compilable, interpretable, and/or executable to configure timing for the graphical program, e.g., upon or during execution of the graphical program.

In one embodiment, the first timing node may have a default timing type, e.g., a specified default type which determines a default underlying functionality for the node. For example, the first timing node may include a default front panel in accordance with the default timing type, including one or more controls and/or indicators for interactively setting and displaying one or more timing parameters during graphical program execution. In another embodiment, the first timing node may have, in addition to, or in place of, the front panel, a default block diagram, comprising a graphical representation of the implementation of timing configuration in accordance with the default timing type.

As mentioned above, in one embodiment, the graphical program is executable to perform a measurement task. The second timing node may then be operable to configure timing functionality in the graphical program for performance of the measurement task. For example, the measurement task may include one or more of a data acquisition task, and a signal generation task. In other words, the computer system may be coupled to one or more data acquisition devices, and execution of the graphical program may invoke a data acquisition process whereby the device(s) acquires data from a data source, e.g., a sensor or other signal source. A function node, e.g., a read node, in the graphical program may then operate to acquire the data from the device and transmit the acquired data to the computer system where the data may be stored or sent to other systems as desired.

In one embodiment, rather than replacing the timing node with a different timing node in response to the timing type selection, the timing node may be configured according to the timing type, where, after being configured, the timing node may be operable to configure timing functionality for the first graphical program in accordance with the timing type. In other words, the timing node may be modified to include the appropriate functionality for the specified timing type. For example, a timing graphical program may be determined which corresponds to the timing type. The timing graphical program, e.g., program instructions, data structures, block diagram, and/or a front panel, may then be associated with the timing node, where during execution of the timing node, the timing graphical program executes to configure timing functionality for the first graphical program in accordance with the timing type.

In an embodiment where the timing node includes an icon, configuring the timing node may include changing the appearance of the timing node icon to visually indicate the timing type and/or the timing functionality.

In another embodiment, rather than the first timing node, an icon which represents a timing function may be displayed on the display. In other words, a place-holder for a timing node may be displayed, e.g., in the graphical program. User input may then be received selecting the icon for configuration, and the plurality of timing type options may be displayed in response. For example, the plurality of timing type options may be displayed in a graphical user interface presented to the user, such as a menu, or other GUI. The icon may be connected to one or more function nodes in the graphical program prior to displaying the plurality of timing type options, where the icon functions as a place-holder for the timing node.

As mentioned above, the above description of the method for specifying timing in the graphical program applies to triggering as well, where triggering for the graphical program is specified using a triggering node. For brevity, the above description is not repeated for the triggering case.

Thus, various embodiments of the systems and methods described above may facilitate the specification of timing and/or triggering in a graphical program with increased flexibility and substantially improved ease of use, compared to prior art methods. More specifically, graphical timing and triggering nodes are described which may easily be typed after inclusion in the graphical program, resulting in a corresponding change in the underlying functionality of the node. The parameters associated with the typed node are limited to those appropriate to the selected type, thereby substantially simplifying timing and triggering configuration for the user. Additionally, in some embodiments, the node may be re-typed as desired, where each type selection results in a corresponding change in the underlying functionality of the node.

BRIEF DESCRIPTION OF THE DRAWINGS

A better understanding of the present invention can be obtained when the following detailed description of the preferred embodiment is considered in conjunction with the following drawings, in which.

Figure 1:
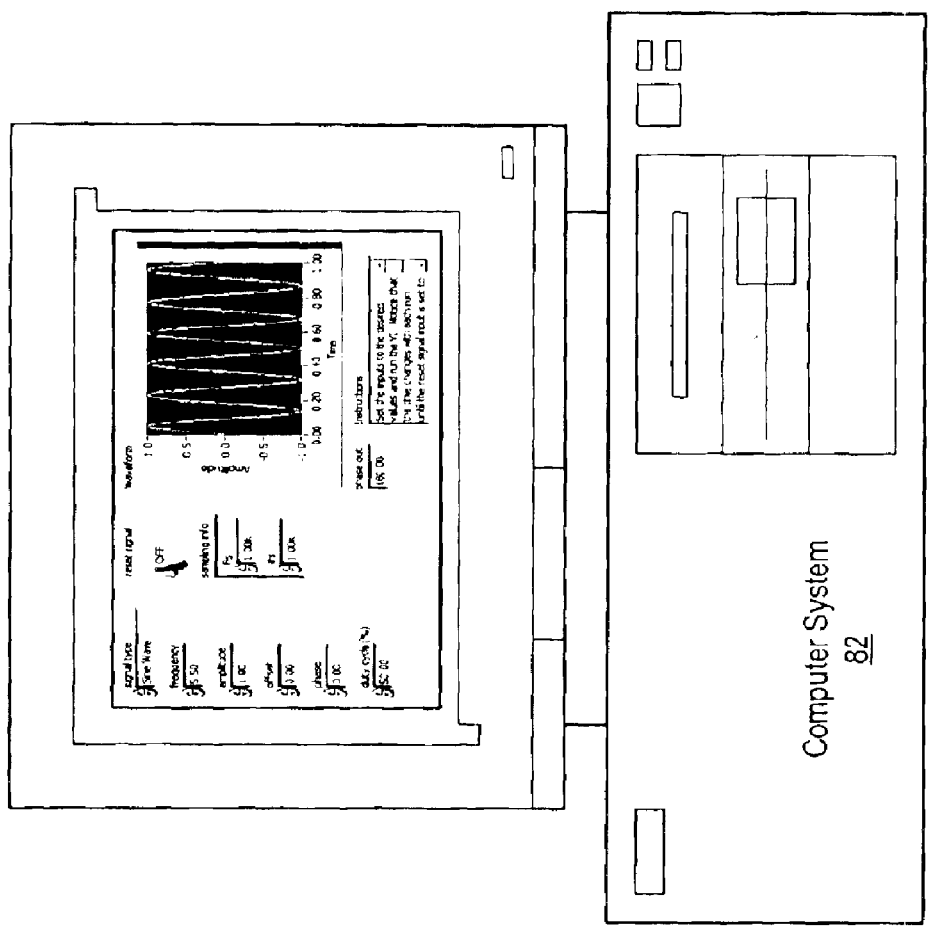
FIG. 1 illustrates a computer system operable to implement various embodiments of the present invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Incorporation by Reference

The following references are hereby incorporated by reference in their entirety as though fully and completely set forth herein:

U.S. Pat. No. 4,914,568 titled "Graphical System for Modeling a Process and Associated Method," issued on Apr. 3, 1990.

U.S. Pat. No. 5,301,301 titled "Polymorphic Dataflow Block Diagram System And Method For Programming A Computer," issued on Apr. 5, 1994.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. patent application Ser. No. 09/617,600 titled "Graphical Programming System with Distributed Block Diagram Execution and Front Panel Display," filed Jun. 13, 2000.

U.S. patent application Ser. No. 09/518,492 titled "System and Method for Programmatically Creating a Graphical Program," filed Mar. 3, 2000.

U.S. patent application Ser. No. 09/745,023 titled "System and Method for Programmatically Generating a Graphical Program in Response to Program Information," filed Dec. 20, 2000.

The LabVIEW and BridgeVIEW graphical programming manuals, including the "G Programming Reference Manual", available from National Instruments Corporation, are also hereby incorporated by reference in their entirety.

FIG. 1—Computer System

FIG. 1 illustrates a computer system 82 suitable for implementing various embodiments of the present invention. One embodiment of a method for specifying timing and/or triggering in a graphical program using graphical program nodes is described below. The computer system 82 may be any type of computer system, including a personal computer system, mainframe computer system, workstation, network appliance, Internet appliance, personal digital assistant (PDA), television system or other device. In general, the term "computer system" can be broadly defined to encompass any device having at least one processor that executes instructions from a memory medium.

As shown in FIG. 1, the computer system 82 may include a display device operable to display the graphical program as the graphical program is created and/or executed. The display device may also be operable to display a graphical user interface or front panel of the graphical program during execution of the graphical program. The graphical user interface may comprise any type of graphical user interface, e.g., depending on the computing platform.

The computer system 82 may include a memory medium(s) on which one or more computer programs or software components according to one embodiment of the present invention may be stored. For example, the memory medium may store one or more graphical programs which are executable to perform the methods described herein. Also, the memory medium may store a graphical programming development environment application used to create and/or execute such graphical programs. The memory medium may also store operating system software, as well as other software for operation of the computer system.

The term "memory medium" is intended to include an installation medium, e.g., a CD-ROM, floppy disks 104, or tape device; a computer system memory or random access memory such as DRAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution.

Various embodiments further include receiving or storing instructions and/or data implemented in accordance with the foregoing description upon a carrier medium. Suitable carrier media include a memory medium as described above, as well as signals such as electrical, electromagnetic, or digital signals, conveyed via a communication medium such as networks and/or a wireless link.

In the present application, the term "graphical program" or "block diagram" is intended to include a program comprising graphical code, e.g., two or more interconnected nodes or icons, wherein the interconnected nodes or icons may visually indicate the functionality of the program. The nodes may be connected in one or more of a data flow, control flow, and/or execution flow format. The nodes may also be connected in a "signal flow" format, which is a subset of data flow. Thus the terms "graphical program" or "block diagram" are each intended to include a program comprising a plurality of interconnected nodes or icons which visually indicate the functionality of the program.

A graphical program may also comprise a user interface or front panel. The user interface portion may be contained in the block diagram or may be contained in one or more separate panels or windows. The user interface of a graphical program may include various graphical user interface elements or front panel objects, such as user interface controls and/or indicators, that represent or display the respective input and/or output that will be used by the graphical program or VI, and may include other icons which represent devices being controlled. The user interface or front panel may be comprised in a single window of user interface elements, or may comprise a plurality of individual windows each having one or more user interface elements, wherein the individual windows may optionally be tiled together. As another example, the user interface or front panel may comprise user interface or front panel objects, e.g., the GUI, embedded in the block diagram. The user interface of a graphical program may display only output, only input, or both input and output. Further, in some embodiments the user interface or front panel of a graphical program may enable the user to interactively control or manipulate the input being provided to the graphical program.

Examples of graphical programming development environments that may be used to create graphical programs include LabVIEW, DasyLab, and DiaDem from National Instruments, VEE from Agilent, WiT from Coreco, Vision Program Manager from PPT Vision, SoftWIRE from Measurement Computing, Simulink from the MathWorks, Sanscript from Northwoods Software, Khoros from Khoral Research, SnapMaster from HEM Data, VisSim from Visual Solutions, ObjectBench by SES (Scientific and Engineering Software), and VisiDAQ from Advantech, among others. In the preferred embodiment, the system uses the LabVIEW graphical programming system available from National Instruments.

Figure 1A:
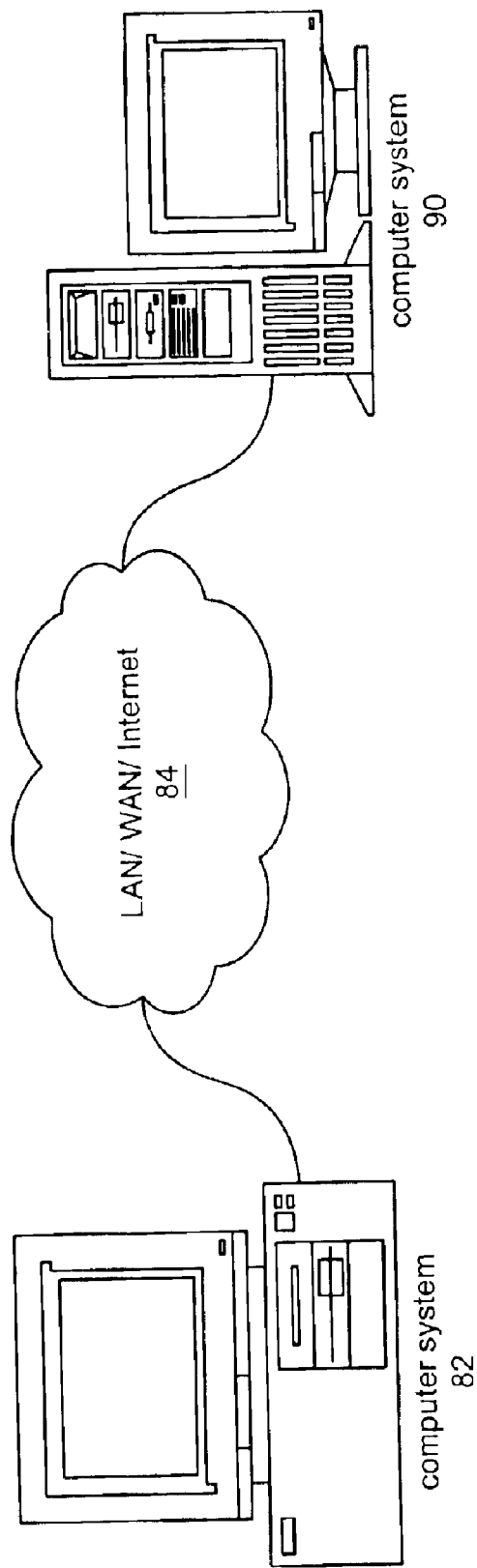
FIG. 1A illustrates a network system comprising two or more computer systems that may implement an embodiment of the present invention.

FIG. 1A—Computer Network

FIG. 1A illustrates a system including a first computer system 82 that displays the graphical user interface of a graphical program and a second computer system 90 that executes the block diagram of the graphical program, wherein the graphical program is operable receive and respond to user interface events, similarly as described above. The computer system 82 may be connected through a network 84 (or a computer bus) to the second computer system 90. The computer systems 82 and 90 may each be any of various types, as desired. Also, the network 84 can also be any of various types, including a LAN (local area network), WAN (wide area network), the Internet, or an Intranet, among others.

Program output of the block diagram executing on the computer system 90 may be displayed in the graphical user interface on a display device of the computer system 82. Also, in response to receiving user input to the graphical user interface, the user input may be provided to the block diagram. The above-incorporated patent application titled "Graphical Programming System with Distributed Block Diagram Execution and Front Panel Display" describes one embodiment of a method enabling graphical program execution and GUI display of the graphical program output to be distributed across multiple computer systems.

In another embodiment, the graphical user interface of the graphical program may be displayed on a display device of the computer system 82, and the block diagram may execute on a reconfigurable instrument 190 connected to the computer system 82. The reconfigurable instrument 190 may include configurable logic, such as a programmable logic device (PLD), e.g., an FPGA, or a processor and memory, which may execute a real time operating system. In one embodiment, the graphical program may be downloaded and executed on the reconfigurable instrument 190. For example, an application development environment with which the graphical program is associated may provide support for downloading a graphical program for execution on configurable logic in a real time system.

Figure 2A:
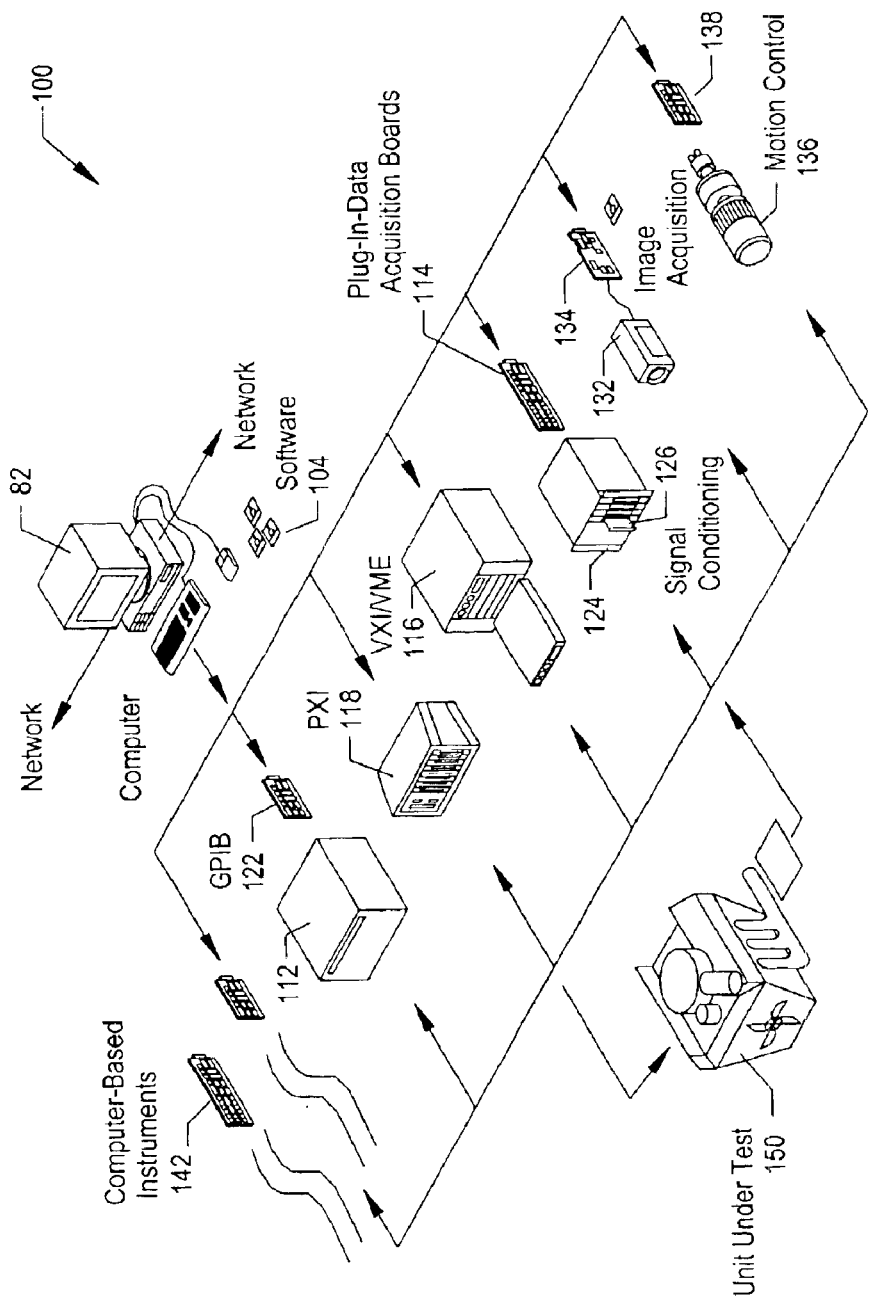
FIG. 2A illustrates an instrumentation control system according to one embodiment of the invention.
Figure 2B:
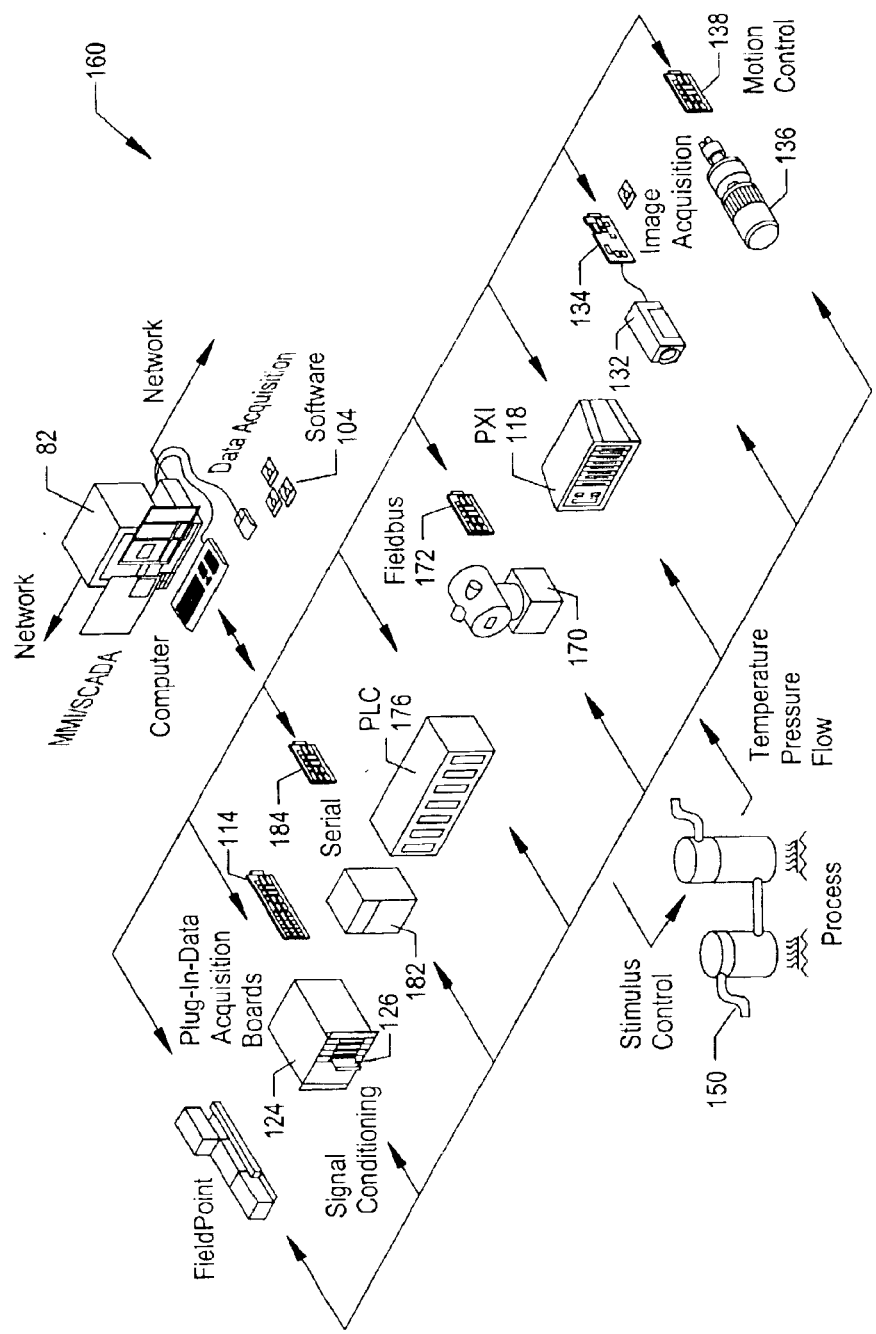
FIG. 2B illustrates an industrial automation system according to one embodiment of the invention.

FIGS. 2A and 2B—Instrumentation and Industrial Automation Systems

The following describes embodiments of the present invention involved with performing test and/or measurement functions and/or controlling and/or modeling instrumentation or industrial automation hardware. However, it is noted that the present invention can be used for a plethora of applications and are not limited to instrumentation or industrial automation applications. In other words, the following description is exemplary only, and the present invention may be used in any of various types of systems. Thus, the system and method of the present invention is operable to be used in any of various types of applications, including the control of other types of devices such as multimedia devices, video devices, audio devices, telephony devices, Internet devices, etc., as well as general purpose software applications such as word processing, spreadsheets, network control, games, etc.

FIG. 2A illustrates an exemplary instrumentation control system 100 which may implement embodiments of the invention. The system 100 comprises a host computer 82 which connects to one or more instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150.

The one or more instruments may include a GPIB instrument 112 and associated GPIB interface card 122, a data acquisition board 114 and associated signal conditioning circuitry 124, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices.

The GPIB instrument 112 may be coupled to the computer 82 via the GPIB interface card 122 provided by the computer 82. In a similar manner, the video device 132 may be coupled to the computer 82 via the image acquisition card 134, and the motion control device 136 may be coupled to the computer 82 through the motion control interface card 138. The data acquisition board 114 may be coupled to the computer 82, and may interface through signal conditioning circuitry 124 to the UUT. The signal conditioning circuitry 124 may comprise an SCXI (Signal Conditioning eXtensions for Instrumentation) chassis comprising one or more SCXI modules 126.

The GPIB card 122, the image acquisition card 134, the motion control interface card 138, and the DAQ card 114 are typically plugged in to an I/O slot in the computer 82, such as a PCI bus slot, a PC Card slot, or an ISA, EISA or MicroChannel bus slot provided by the computer 82. However, these cards 122, 134, 138 and 114 are shown external to computer 82 for illustrative purposes. These devices may also be connected to the computer 82 through a serial bus or through other means.

The VXI chassis or instrument 116 may be coupled to the computer 82 via a VXI bus, MXI bus, or other serial or parallel bus provided by the computer 82. The computer 82 may include VXI interface logic, such as a VXI, MXI or GPIB interface card (not shown), which interfaces to the VXI chassis 116. The PXI chassis or instrument may be coupled to the computer 82 through the computer's PCI bus.

A serial instrument (not shown) may also be coupled to the computer 82 through a serial port, such as an RS-232 port, USB (Universal Serial bus) or IEEE 1394 or 1394.2 bus, provided by the computer 82. In typical instrumentation control systems an instrument will not be present of each interface type, and in fact many systems may only have one or more instruments of a single interface type, such as only GPIB instruments.

The instruments may be coupled to a unit under test (JUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application.

FIG. 2B illustrates an exemplary industrial automation system 160 which may implement embodiments of the invention. The industrial automation system 160 is similar to the instrumentation or test and measurement system 100 shown in FIG. 2A. Elements which are similar or identical to elements in FIG. 2A have the same reference numerals for convenience. The system 160 may comprise a computer 82 which connects to one or more devices or instruments. The computer 82 may comprise a CPU, a display screen, memory, and one or more input devices such as a mouse or keyboard as shown. The computer 82 may operate with the one or more devices to a process or device 150 to perform an automation function, such as MMI (Man Machine Interface), SCADA (Supervisory Control and Data Acquisition), portable or distributed data acquisition, process control, advanced analysis, or other control.

The one or more devices may include a data acquisition board 114 and associated signal conditioning circuitry 124, a PXI instrument 118, a video device 132 and associated image acquisition card 134, a motion control device 136 and associated motion control interface card 138, a fieldbus device 170 and associated fieldbus interface card 172, a PLC (Programmable Logic Controller) 176, a serial instrument 182 and associated serial interface card 184, or a distributed data acquisition system, such as the Fieldpoint system available from National Instruments, among other types of devices.

The DAQ card 114, the PXI chassis 118, the video device 132, and the image acquisition card 134 may be connected to the computer 82 as described above. The serial instrument 182 may be coupled to the computer 82 through a serial interface card 184, or through a serial port, such as an RS-232 port, provided by the computer 82. The PLC 176 may couple to the computer 82 through a serial port, Ethernet port, or a proprietary interface. The fieldbus interface card 172 may be comprised in the computer 82 and may interface through a fieldbus network to one or more fieldbus devices. Each of the DAQ card 114, the serial card 184, the fieldbus card 172, the image acquisition card 134, and the motion control card 138 are typically plugged in to an I/O slot in the computer 82 as described above. However, these cards 114, 184, 172, 134, and 138 are shown external to computer 82 for illustrative purposes. In typical industrial automation systems a device will not be present of each interface type, and in fact many systems may only have one or more devices of a single interface type, such as only PLCs. The devices may be coupled to the device or process 150.

As used herein, the term "instrument" is intended to include any of the devices that are adapted to be connected to a computer system as shown in FIGS. 2A and 2B, traditional "stand-alone" instruments, as well as other types of measurement and control devices. The term "measurement function" may include any type of data acquisition, measurement or control function, such as that implemented by the instruments shown in FIGS. 2A and 2B. For example, the term "measurement function" includes acquisition and/or processing of an image. As described below, a graphical program may be created that implements a measurement function. For example, the graphical program may be used to acquire a signal and perform the measurement function on the acquired signal.

In the embodiments of FIGS. 2A and 2B above, one or more of the various instruments may couple to the computer 82 over a network, such as the Internet. In one embodiment, the user operates to select a target instrument or device from a plurality of possible target devices for programming or configuration according to the present invention. Thus the user may create or deploy a graphical program on a computer and use the graphical program in conjunction with a target device or instrument that is remotely located from the computer and coupled to the computer through a network.

Graphical software programs which perform data acquisition, analysis and/or presentation, e.g., for measurement, instrumentation control, industrial automation, or simulation, such as in the applications shown in FIGS. 2A and 2B, may be referred to as virtual instruments.

Figure 3:
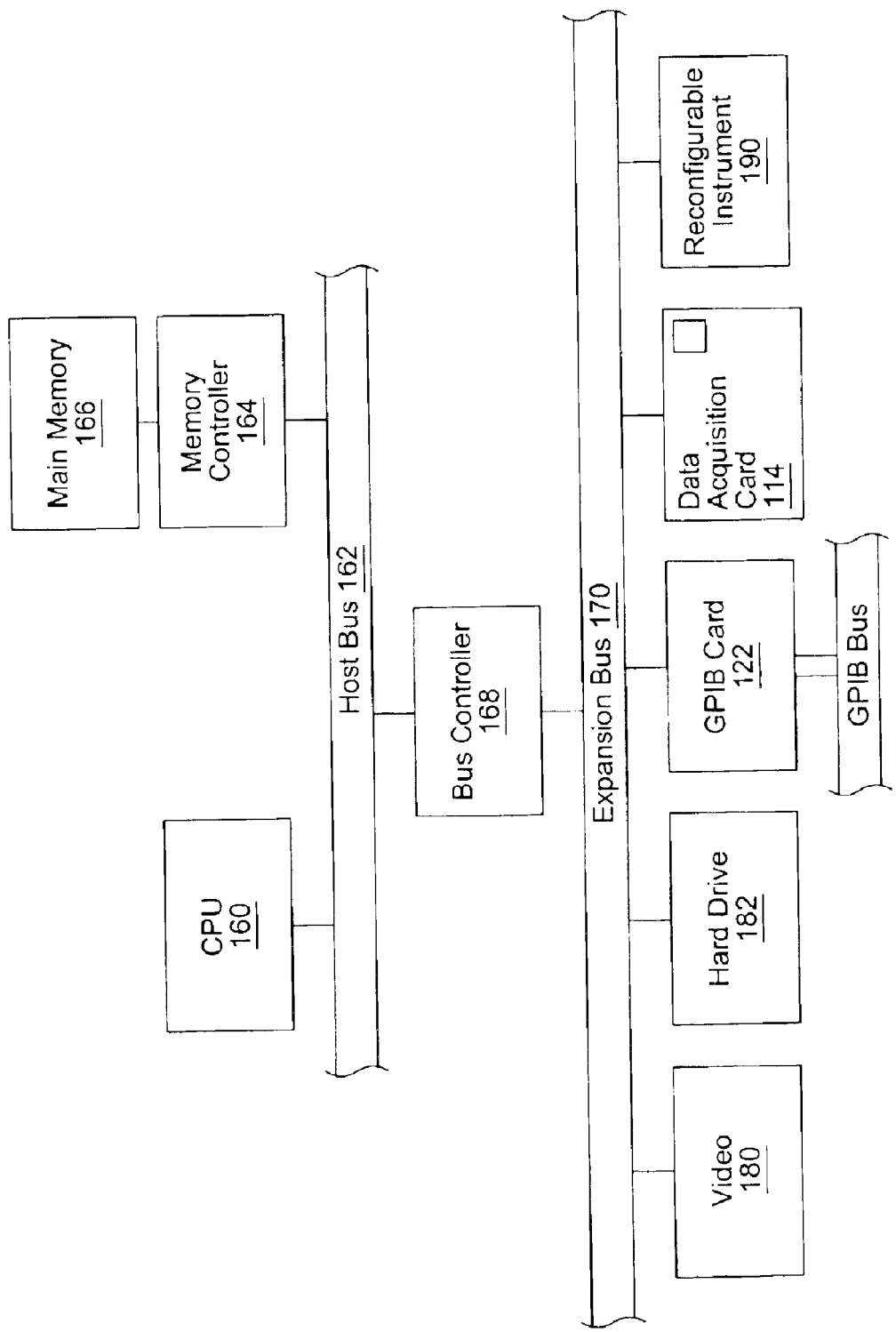
FIG. 3 is an exemplary block diagram of the computer systems of FIGS. 1, 1A, 2A and 2B.

FIG. 3—Computer System Block Diagram

FIG. 3 is a block diagram representing one embodiment of the computer system 82 and/or 90 illustrated in FIGS. 1 and 1A, or computer system 82 shown in FIG. 2A or 2B. It is noted that any type of computer system configuration or architecture can be used as desired, and FIG. 3 illustrates a representative PC embodiment. It is also noted that the computer system may be a general purpose computer system, a computer implemented on a VXI card installed in a VXI chassis, a computer implemented on a PXI card installed in a PXI chassis, or other types of embodiments. Elements of a computer not necessary to understand the present description have been omitted for simplicity.

The computer may include at least one central processing unit or CPU 160 which is coupled to a processor or host bus 162. The CPU 160 may be any of various types, including an x86 processor, e.g., a Pentium class, a PowerPC processor, a CPU from the SPARC family of RISC processors, as well as others. Main memory 166 is coupled to the host bus 162 by means of memory controller 164. The main memory 166 may store graphical program software operable to implement various embodiments of the present invention. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as a data acquisition board 114 and a GPIB interface card 122 which provides a GPIB bus interface to a GPIB instrument. The computer 82 further comprises a video display subsystem 180 and hard drive 182 coupled to the expansion bus 170.

As shown, a reconfigurable instrument 190 may also be connected to the computer. The reconfigurable instrument 190 may include configurable logic, such as a programmable logic device, e.g., an FPGA, or a processor and memory, which may execute a real time operating system. According to one embodiment, a created graphical program that utilizes one or more SDB nodes may be deployed on the reconfigurable instrument 190. For example, a graphical programming development environment with which the graphical program is associated may provide support for configuring the reconfigurable instrument 190 to execute at least a portion of the graphical program. In various embodiments, the configurable logic may be comprised on an instrument or device connected to the computer through means other than an expansion slot, e.g., the instrument or device may be connected via an IEEE 1394 bus, USB, or other type of port, or may be connected via a network. Also, the configurable logic may be comprised on a device such as the data acquisition board 114 or another device shown in FIG. 2A or 2B.

Figure 5A:
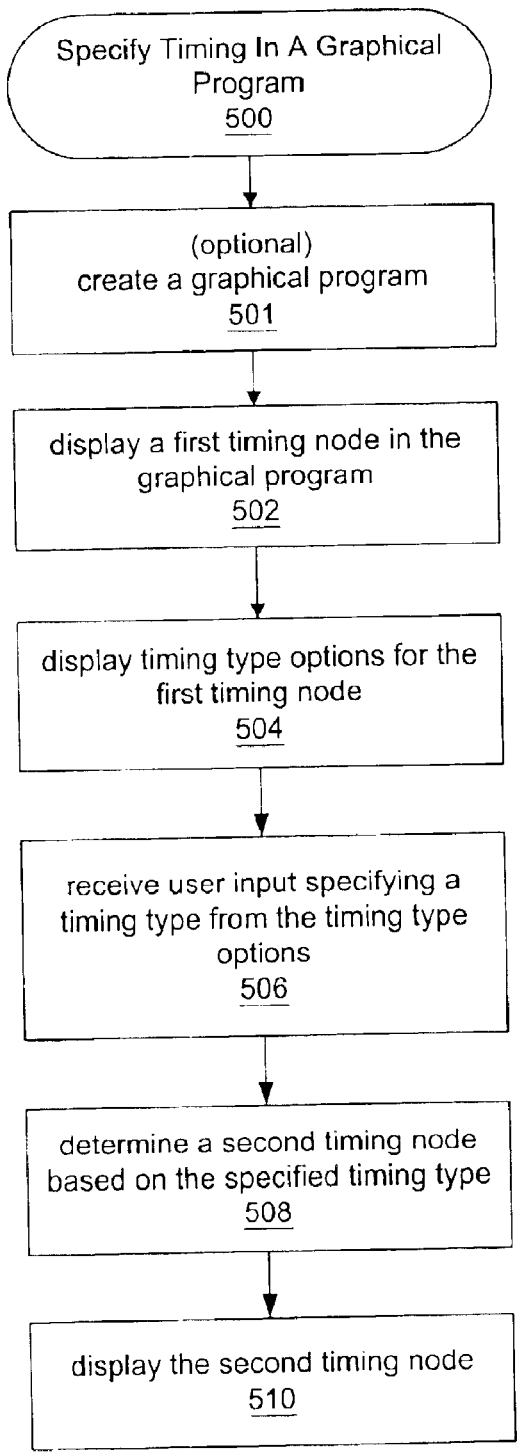
FIGS. 5A and 5B flowchart respective methods for specifying timing and triggering in a graphical program for performing a task, according to one embodiment.
Figure 5B:
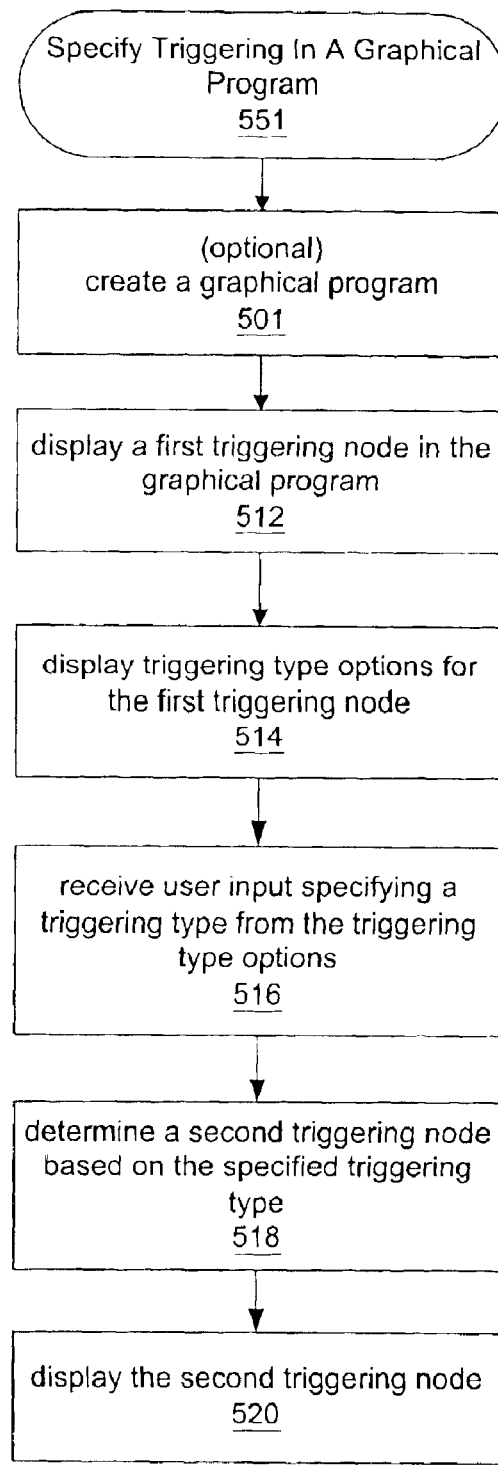

FIGS. 5A and 5B—Flowcharts of Methods for Specifying Timing and Triggering

FIGS. 5A and 5B respectively illustrate methods for configuring an instrument to perform a measurement function, where the methods operate in a computer including a memory, a display and a user input device. More specifically, FIGS. 5A and 5B respectively illustrate exemplary embodiments of a method for specifying timing and triggering in a graphical program for performing a task, e.g., a measurement task. The methods shown in FIGS. 5A and 5B may be used to configure any of the instruments shown in FIGS. 2A and 2B to perform a measurement function, although various embodiments of the present invention are also applicable to any other type of task utilizing timing and/or triggering, as well. The methods presented in FIGS. 5A and 5B are substantially the same, differing only in that the method of FIG. 5A relates to timing, and the method of FIG. 5B related to triggering. Thus, the following description of timing specification applies equally to the method of 5B, but where triggering is specified via a triggering node, as opposed to timing. It is noted that in various embodiments, some of the steps may be performed in a different order than shown, or may be omitted. Additional steps may also be performed, as desired. As shown, in one embodiment, this method may operate as follows.

First, in step 501 a graphical program may optionally be created on the computer system 82 (or on a different computer system). The graphical program may be created or assembled by the user arranging on a display a plurality of nodes or icons and then interconnecting the nodes to create the graphical program. In response to the user assembling the graphical program, data structures may be created and stored which represent the graphical program. The nodes may be interconnected in one or more of a data flow, control flow, or execution flow format. The graphical program may thus comprise a plurality of interconnected nodes or icons which visually indicates the functionality of the program. As noted above, the graphical program may comprise a block diagram and may also include a user interface portion or front panel portion. Where the graphical program includes a user interface portion, the user may assemble the user interface on the display. As one example, the user may use the LabVIEW graphical programming development environment to create the graphical program.

In an alternate embodiment, the graphical program may be created in step 501 by the user creating or specifying a prototype, followed by automatic or programmatic creation of the graphical program from the prototype. This functionality is described in U.S. patent application Ser. No. 09/587,682 titled "System and Method for Automatically Generating a Graphical Program to Perform an Image Processing Algorithm", which is hereby incorporated by reference in its entirety as though fully and completely set forth herein. The graphical program may be created in other manners, either by the user or programmatically, as desired. The graphical program may implement a measurement function that is desired to be performed by the instrument, e.g., in an application where the instrument is an image acquisition device (e.g., smart camera 190), the graphical program may implement an image processing function.

Figure 7A:
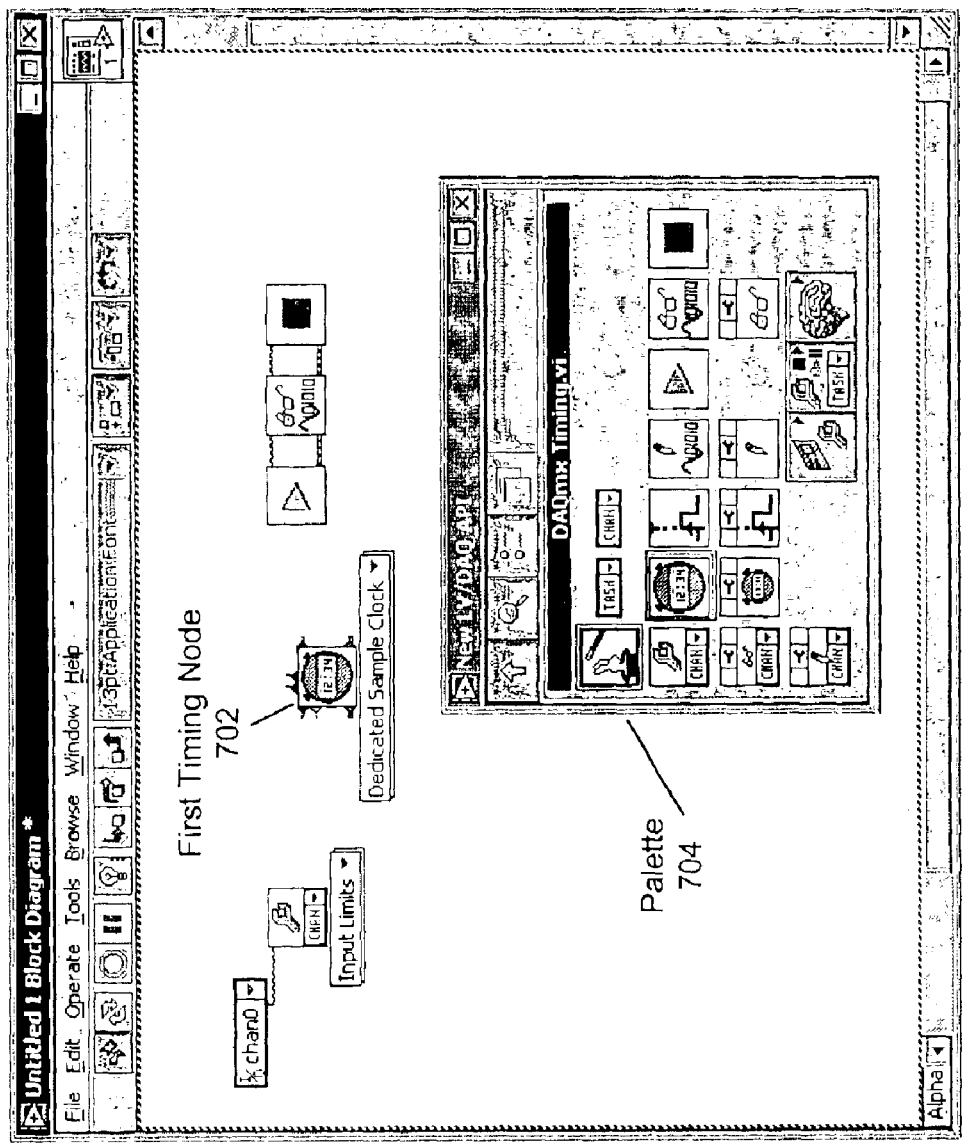
FIGS. 7A–7C are examples of screen shots illustrating deployment and typing of a timing node in a graphical program, according to one embodiment.
Figure 7B:
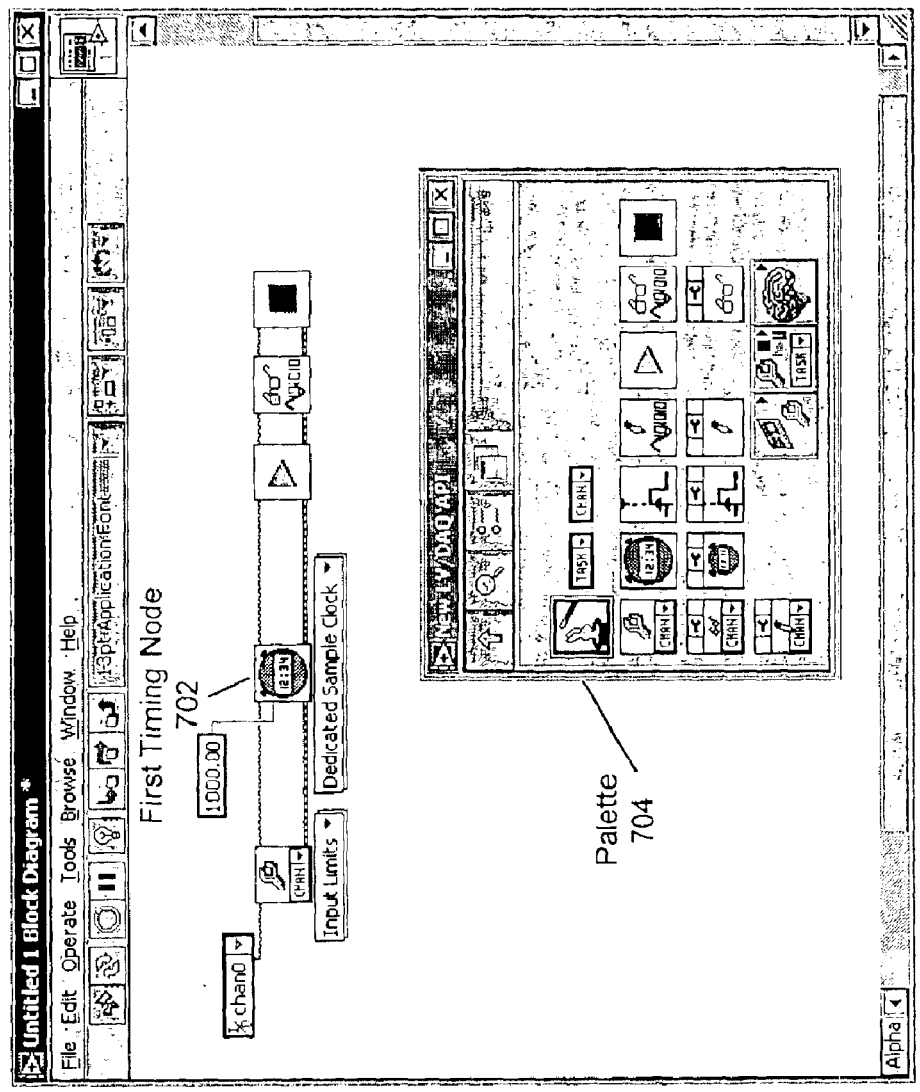

In step 502, a first timing node may be displayed in the graphical program, e.g., on a display of the computer 82. In one embodiment, the first timing node may be displayed in the graphical program on the display of the computer system in response to user input specifying the first timing node. For example, the user input specifying the first timing node may include the user dragging and dropping the first timing node from a palette to the graphical program. Example screen shots of the first timing node being displayed in the graphical program are shown in FIGS. 7A–7B, and described below.

Figure 7C:
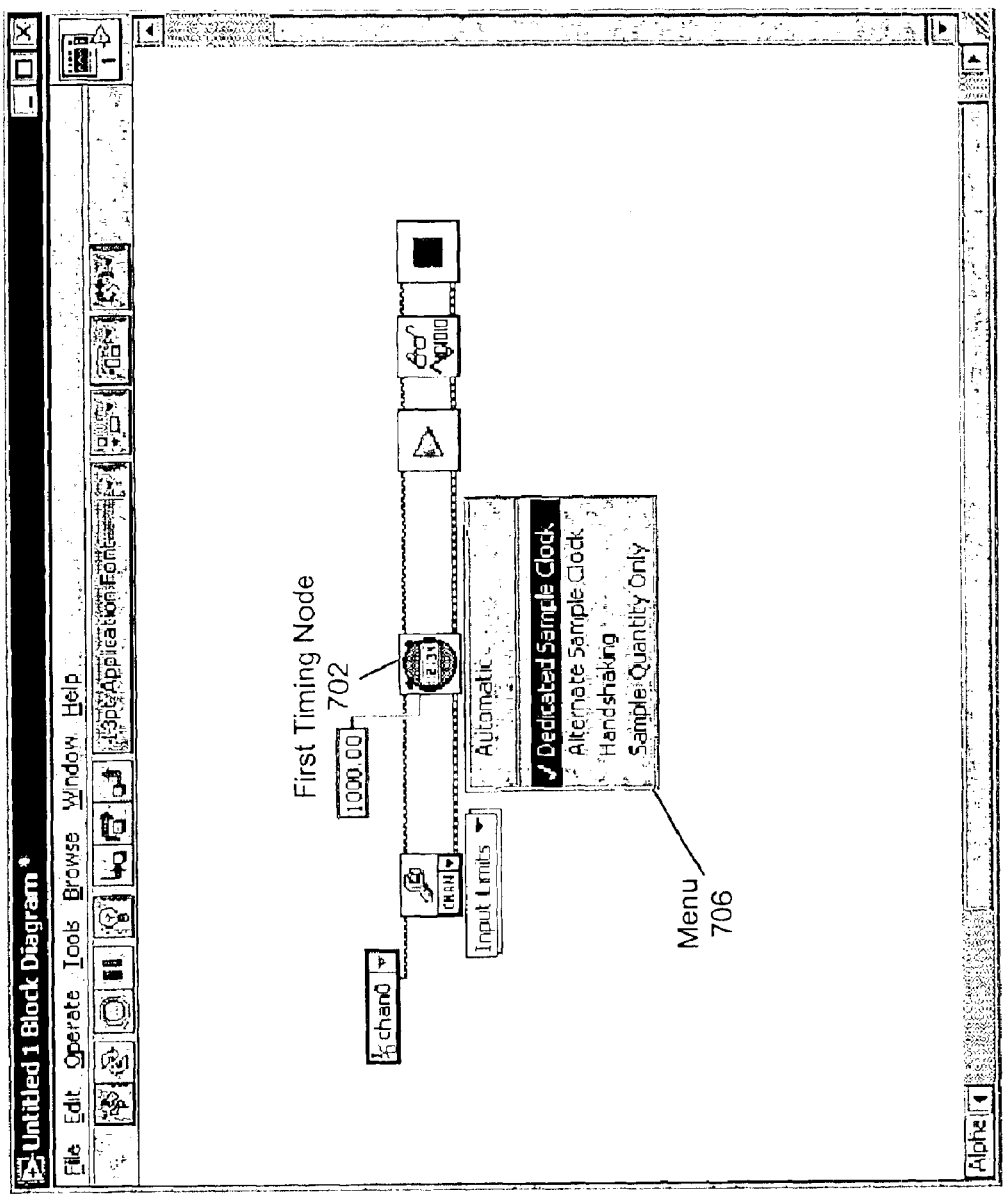

In step 504, a plurality of timing type options for the first timing node may be displayed on the display. In one embodiment, the timing type options may be presented in response to user input. For example, the user may right-click on the first timing node, and a graphical user interface, e.g., a menu, may be presented showing the available timing type options. In another embodiment, the timing type options may be presented automatically when the timing node is deployed to the graphical program. In one embodiment, the first timing node may be connected (e.g., in response to user input) to one or more function nodes in the graphical program prior to displaying the plurality of timing type options, where the first timing node is then operable to configure timing functionality for the one or more function nodes. An example screen shot of the plurality of timing type options being displayed is shown in FIG. 7C, and described below.

In response to the display of the timing type options of 504, user input may be received specifying a timing type from the plurality of timing type options, as indicated in 506. For example, the user may select the timing type from the plurality of timing type options by double-clicking on a menu item.

Then, in 508, a second timing node may be determined based on the user input specifying the timing type, and in 510, the second timing node may be displayed on the display in the graphical program in place of the first timing node. The second timing node may be operable to configure timing functionality for the graphical program in accordance with the timing type. For example, the second timing node may be operable to be connected to one or more function nodes in the graphical program to configure timing functionality in accordance with the specified timing type. In other words, as described above, user input to the graphical program may be received connecting the second timing node to the one or more function nodes in the graphical program, e.g., by "wiring" the nodes together. During execution of the graphical program, the second timing node may then configure timing functionality for the one or more function nodes.

In one embodiment, the first timing node may be polymorphic. As used herein, the term "polymorphic" refers to nodes which share a name and/or an icon, but which have different functionality. Generally, the particular functionality required for the node is determined based upon the inputs and/or outputs of the node, i.e., upon the timing type specified or selected for the node. Thus, the first polymorphic timing node may share a name and/or an icon with one or more other timing nodes, or timing node functionalities, where, depending upon the selected timing type, the underlying functionality of the node may be changed or exchanged in accordance with the selected timing type.

In one embodiment, the second timing node may also be polymorphic, as defined above. The second timing node may include a second timing node icon, which is used to display the second timing node in the graphical program (or in a palette of nodes). In one embodiment, the second timing node may also include a block diagram, comprising a graphical representation of the implementation of timing configuration in accordance with the specified timing type. Thus, the block diagram may graphically illustrate the underlying functionality of the second timing node. In addition to the block diagram, the second timing node may also include a front panel. The front panel may include one or more controls and/or indicators for interactively setting and displaying one or more timing parameters during graphical program execution in accordance with the specified timing type. Examples of block diagrams and front panels are shown in FIGS. 8A–9B, and FIGS. 11A–12B, and described below.

In another embodiment, in addition to the second timing node icon, the second timing node may include program instructions and/or data structures for implementing timing configuration in accordance with the specified timing type. For example, the second timing node may include program instructions and/or data structures in a text-based programming language such as C or C++ (or any other programming language) which is compilable, interpretable, and/or executable to configure timing for the graphical program, e.g., upon or during execution of the graphical program.

In yet another embodiment, in addition to the second timing node icon, the second timing node may include a front panel as described above, where the front panel includes one or more controls and/or indicators for interactively setting and displaying one or more timing parameters during graphical program execution in accordance with the specified timing type, as described above. Thus, in various embodiments, the second timing node may include one or more of the second timing icon, the front panel, and the block diagram.

The front panel may be displayed on the display of the computer, and user input may be received by the front panel specifying a value for at least one of the one or more timing parameters. The second timing node may then be operable to configure timing functionality in the graphical program in accordance with the one or more timing parameters. The block diagram may similarly be displayed on the display, thus illustrating to the user the underlying functionality of the second timing node.

In one embodiment, the first timing node may have a default timing type. In other words, the first timing node may have a specified default type which determines a default underlying functionality for the node. For example, the first timing node may include a default front panel in accordance with the default timing type, including one or more controls and/or indicators for interactively setting and displaying one or more timing parameters during graphical program execution. In another embodiment, the first timing node may have, in addition to, or in place of, the front panel, a default block diagram, comprising a graphical representation of the implementation of timing configuration in accordance with the default timing type. Thus, in this embodiment, if the user does not select a timing type from the timing type options, the first timing node may have or assume the default type, with the associated default functionality.

As mentioned above, in one embodiment, the graphical program is executable to perform a measurement task. The second timing node may then be operable to configure timing functionality in the graphical program for performance of the measurement task. For example, the measurement task may include one or more of a data acquisition task, and a signal generation task. For example, the computer system 82 may be coupled to one or more data acquisition devices, and execution of the graphical program may invoke a data acquisition process whereby the device(s) acquires data from a data source, e.g., a sensor or other signal source. A function node, e.g., a read node, in the graphical program may then operate to acquire the data from the device and transmit the acquired data to the computer system where the data may be stored or sent to other systems as desired.

Similarly, the computer system 82 may be coupled to one or more signal generation devices, and execution of the graphical program may invoke a signal generation process whereby the device(s) generate one or more signals in accordance with parameters or data supplied by software executing in the computer 82. In other words, a function node, e.g., a write node, in the graphical program may operate to send data to the device(s), and the device(s) may then generate signals based on the data, where the generated signals may be used for unit testing, control, alarms, etc. Thus, in one embodiment, the graphical program may be executed to perform a task, e.g., a measurement task, where the second timing node executes to configure timing functionality in the graphical program for performance of the task.

In a further embodiment, the second timing node may include the second timing node icon, and a graphical user interface (GUI), where the GUI includes the one or more controls and/or indicators for enabling a user to set and/or display one or more timing parameters prior to graphical program execution in accordance with the specified timing type. In other words, the GUI may provide the user means to configure the timing parameters before execution of the graphical program.

In one embodiment of the present invention, rather than replacing the timing node with a different timing node in response to the timing type selection, the timing node may be configured according to the timing type, where, after being configured, the timing node may be operable to configure timing functionality for the first graphical program in accordance with the timing type. In other words, the timing node may be modified to include the appropriate functionality for the specified timing type. For example, in response to the user input specifying the timing type, a timing graphical program may be determined which corresponds to the timing type. The timing graphical program may then be associated with the timing node, where during execution of the timing node, the timing graphical program executes to configure timing functionality for the first graphical program in accordance with the timing type. Said another way, program instructions and/or data structures may be associated with the timing node, where the program instructions and/or data structures are executable to configure timing functionality for the first graphical program in accordance with the timing type. In other words, during execution of the timing node, the program instructions and/or data structures may execute to configure timing functionality for the first graphical program in accordance with the timing type.

In one embodiment, configuring the timing node may include creating the program instructions and/or data structures in the memory of the computer system, then associating the program instructions and/or data structures with the timing node, as described above. Similarly, configuring the timing node may include determining a front panel in response to the user input specifying the timing type, where the front panel corresponds to the timing type, and associating the front panel with the timing node.

In an embodiment where the timing node includes an icon, configuring the timing node may include changing the appearance of the timing node icon to visually indicate the timing type and/or the timing functionality. For example, the node icon's color, shape, and/or design may be modified to reflect the type or functionality of the node. In one embodiment, the terminals of the node (icon) may be modified in accordance with the specified type.

As mentioned above, the above description of the method for specifying timing in the graphical program also applies to the method of FIG. 5B, where triggering for the graphical program is specified using a triggering node. For brevity, the above description is not repeated for the triggering case.

Figure 6A:
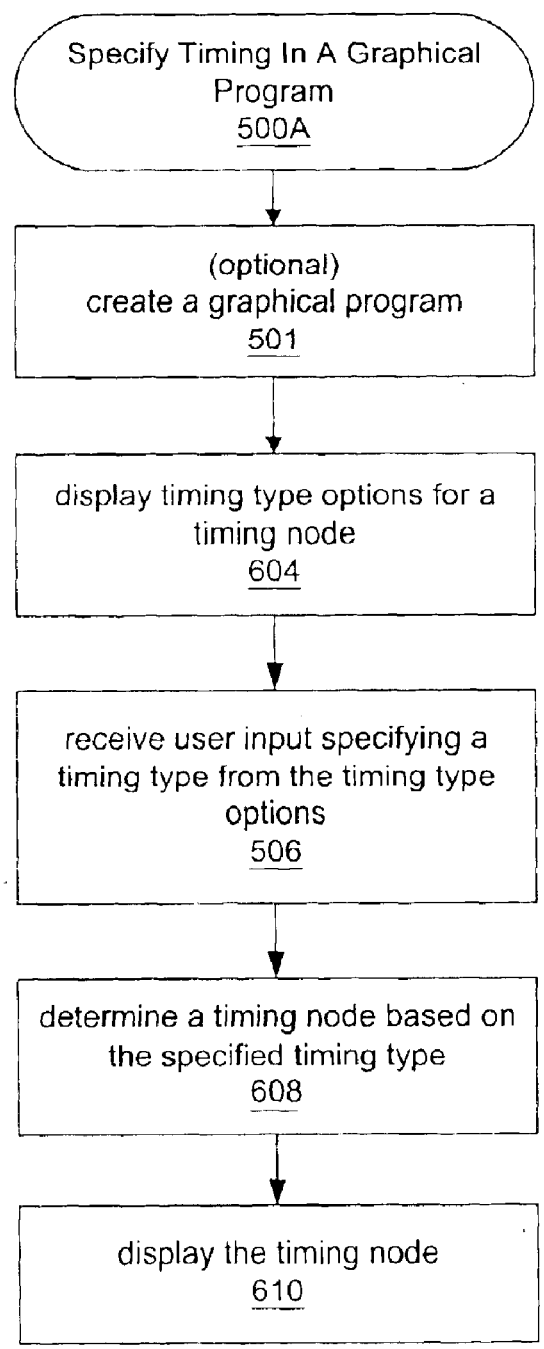
FIGS. 6A and 6B flowchart further embodiments of the methods of FIGS. 5A and 5B, respectively.
Figure 6B:
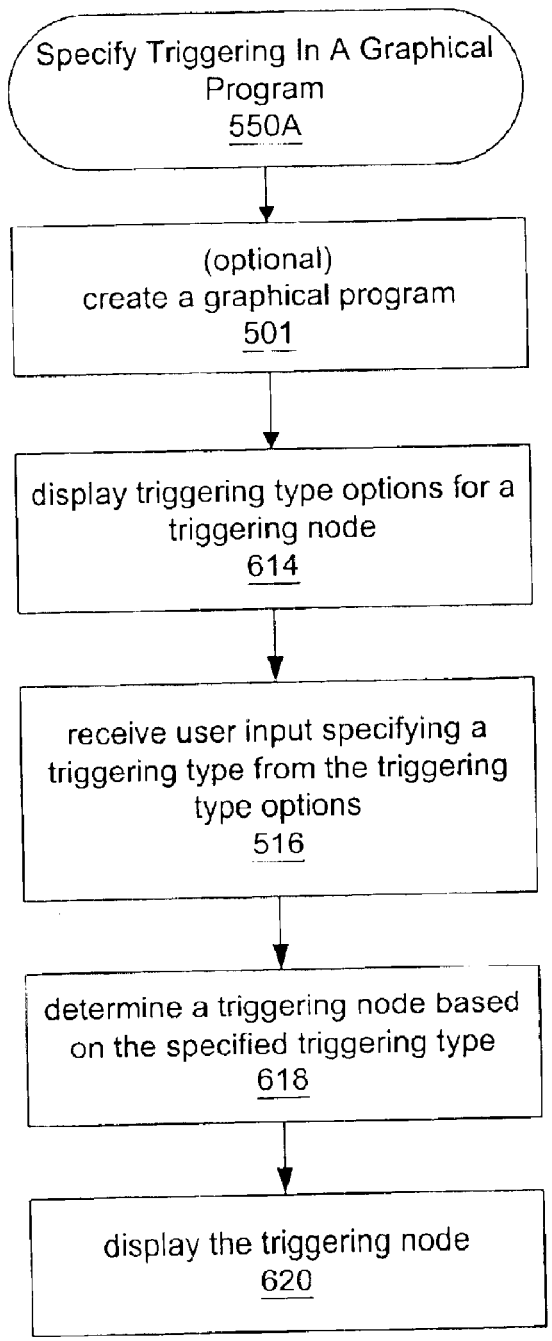

FIGS. 6A and 6B—Further Flowcharts of Methods for Specifying Timing and Triggering FIGS. 6A and 6B respectively illustrate further embodiments of the methods of FIGS. 5A and 5B. The methods presented in FIGS. 6A and 6B are substantially the same, differing only in that the method of FIG. 6A relates to timing, and the method of FIG. 6B relates to triggering. Thus, the following description of timing specification applies equally to the method of 6B, but where triggering is specified via a triggering node, as opposed to timing. It is noted that in various embodiments, some of the steps may be performed in a different order than shown, or may be omitted. Additional steps may also be performed, as desired. As shown, in one embodiment, this method may operate as follows.

As FIG. 6A shows, in 501, a graphical program may optionally be created on the computer system 82 (or on a different computer system), as described above in step 501 of FIG. 5A.

In 604, a plurality of timing type options for a timing node may be displayed on the display. As mentioned above in 504, the timing type options may be presented in response to user input. For example, the user may select a timing node from a palette, or indicate a need for a timing node, and the method may present a menu in response, e.g., a pop-up menu, which displays the timing type options. Note that in this embodiment, in contrast to the method of FIG. 5A, an initial "first" timing node is not displayed in the graphical program prior to the presentation of the timing type options, but rather, as soon as the user indicates that a timing node is to be included in the graphical program, the method presents the timing type options. In other embodiments, the timing type options may be displayed automatically, e.g., the graphical program may automatically present the type options when the graphical program is displayed.

In response to the display of the timing type options of 604, user input may be received specifying a timing type from the plurality of timing type options, as indicated in 506. For example, the user may select the timing type from the plurality of timing type options by double-clicking on a menu item, e.g., in a pop-up menu. As mentioned above, in one embodiment, a default timing type may be included, such that if the user does not select a timing type, then the default timing type will apply.

Then, in 608, a timing node may be determined based on the user input specifying the timing type, and in 610, the timing node may be displayed on the display in the graphical program. As described above, the timing node may be operable to configure timing functionality for the graphical program in accordance with the timing type, e.g., by being connected to one or more function nodes in the graphical program. During execution of the graphical program, the timing node may then configure timing functionality for the one or more function nodes.

In one embodiment, a first timing node may be displayed on the computer display in the graphical program prior to displaying the plurality of timing type options in 604. Then, user input may be received selecting the first timing node for configuration, in response to which the plurality of timing type options may be displayed. In one embodiment, the first timing node may be connected (e.g., in response to user input) to one or more function nodes in the graphical program prior to displaying the plurality of timing type options, where the first timing node is then operable to configure timing functionality for the one or more function nodes. In various embodiments, the first timing node may be displayed in response to user input as described above, or automatically, e.g., the graphical program may automatically include nodes for basic functionality, such as timing and/or triggering.

In another embodiment, an icon which represents a timing function may be displayed on the display. In other words, a place-holder for a timing node may be displayed, e.g., in the graphical program. As used herein, the term "place-holder" refers to an element (the icon) which temporarily occupies the place of a node in the graphical program, but which has little or none of the functionality of the node. User input may then be received selecting the icon for configuration, and the plurality of timing type options displayed in response. For example, the plurality of timing type options may be displayed in a graphical user interface presented to the user, such as a menu, or other GUI. As mentioned above, in one embodiment, the icon may be connected to one or more function nodes in the graphical program prior to displaying the plurality of timing type options, where the icon is operable to function as a place-holder for the timing node.

As mentioned above, the above description of the method for specifying timing in the graphical program also applies to the method of FIG. 6B, where triggering for the graphical program is specified using a triggering node. For brevity, the above description is not repeated for the triggering case.

FIGS. 7A–7C—Deploying a Timing Node

FIGS. 7A–7C are example screen shots illustrating the deployment and typing of a timing node in a graphical program, as described above, according to one embodiment. As FIG. 7A shows, a first timing node 702 has been selected, e.g., from a palette 704, and added to the graphical program, as described above in step 502 of FIG. 5A. Note than in this embodiment, the selected timing node 702 has a default type, namely, "Dedicated Sample Clock", as shown by the node label. FIG. 7B illustrates the selected timing node 702 connected to function nodes in the graphical program. The timing node 702 may now be operable to provide timing configuration functionality to the function nodes.

FIG. 7C illustrates one embodiment of the presentation of, and selection from, the plurality of timing type options, as described above in steps 504 and 506 of FIG. 5A. As FIG. 7C shows, in this embodiment, a pop-up menu 706 is displayed, e.g., in response to user input, which presents four timing type options, including Dedicated Sample Clock, Alternate Sample Clock, Handshaking, and Sample Quantity Only, which denote various timing functionality types familiar to those skilled in the art. As FIG. 7C also shows, in this example, the first listed timing type, "Dedicated Sample Clock", is the default type, and is shown selected. Of course, the user could select any of the other types, as well. As described above, once the node has been typed (by selection of the type by the user), the node may be operable to configure timing functionality for the graphical program in accordance with the selected timing type.

Figure 8A:
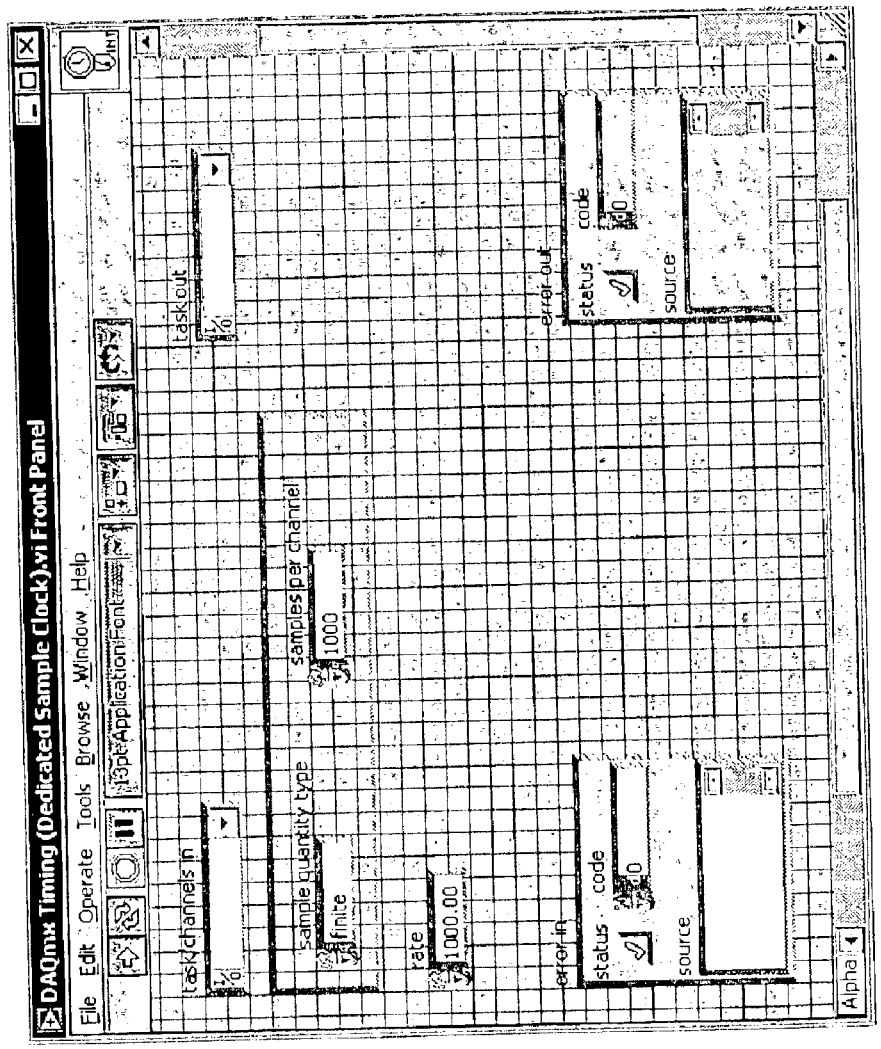
FIGS. 8A and 8B illustrate an exemplary front panel and block diagram for the timing node of FIGS. 7A–7C, according to one embodiment.
Figure 8B:
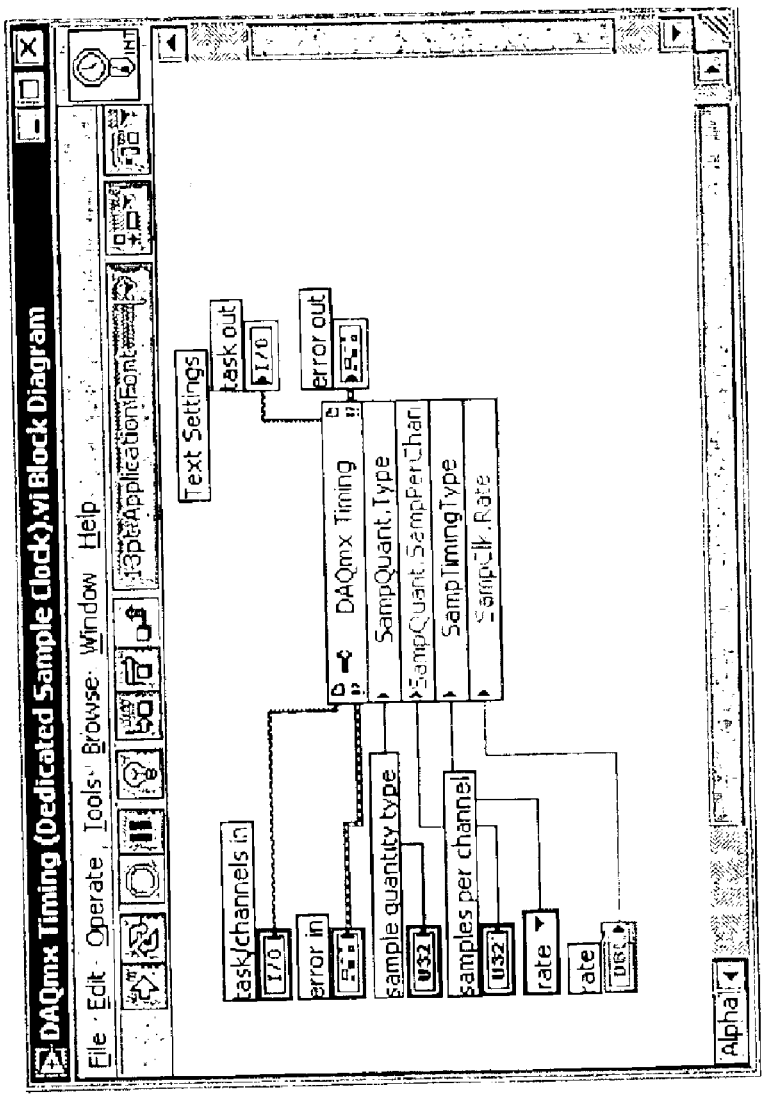

FIGS. 8A–8B—Underlying Structure of Timing Node of Type: Dedicated Sample Clock

Figure 4A:
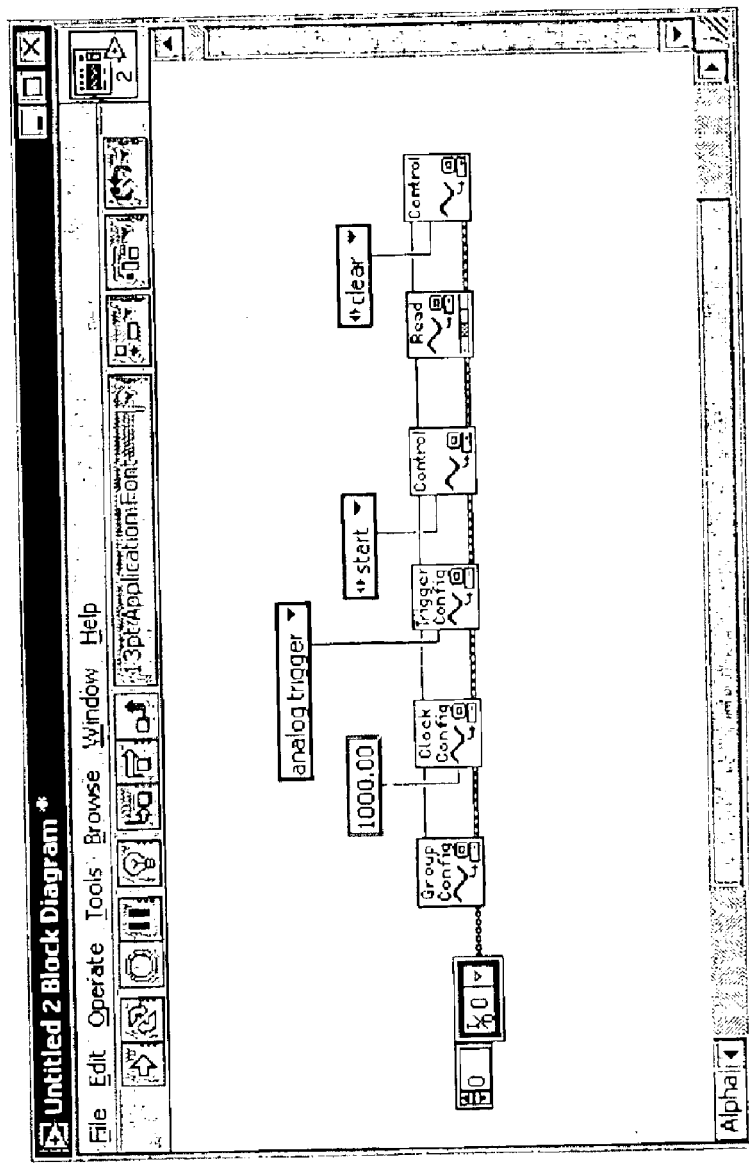
FIGS. 4A–4E illustrate graphical program elements for timing and triggering in a graphical program for performing a data acquisition task, according to the prior art.
Figure 4B:
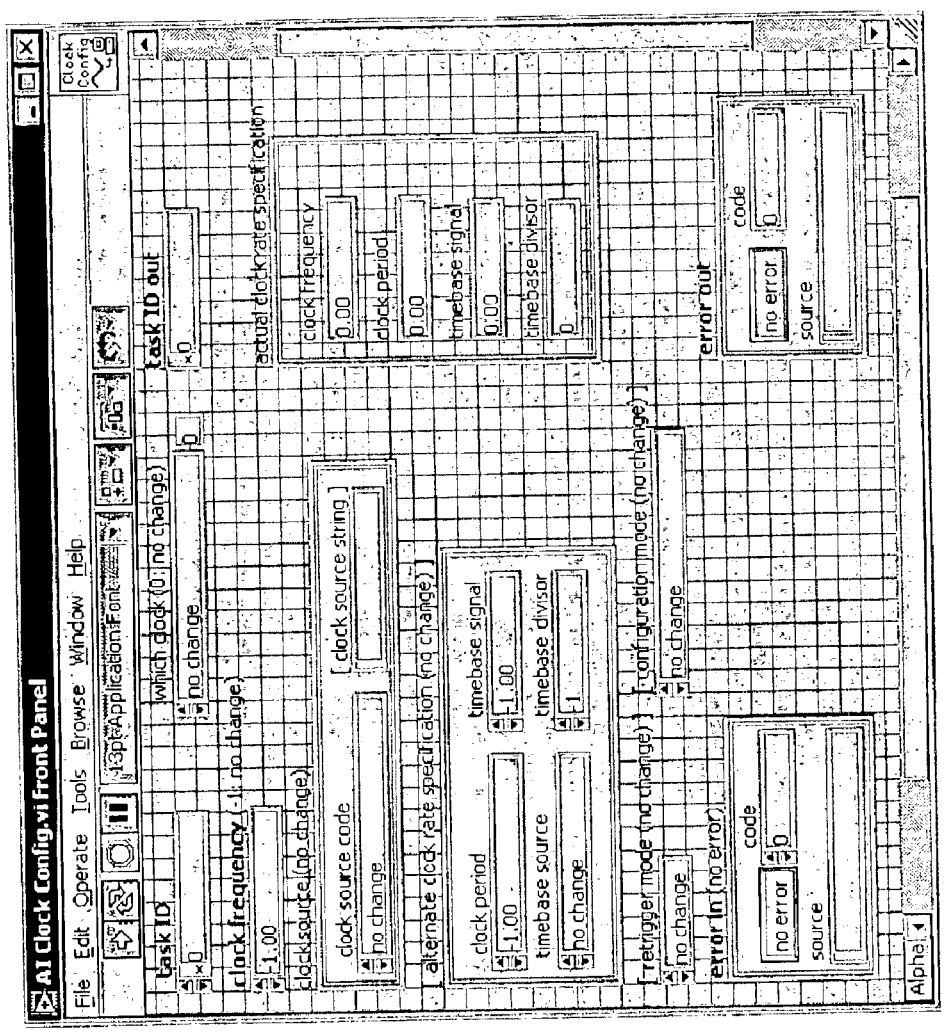

FIGS. 8A and 8B respectively illustrate a front panel and block diagram for the timing node of FIGS. 7A–7C, according to one embodiment. As FIG. 8A shows, the front panel presents parameters corresponding to the timing type "Dedicated Sample Clock". Comparing the front panel of FIG. 8A to the prior art front panel of FIG. 4B, which includes the superset of timing parameters for all timing types, the front panel of FIG. 8A is clearly much simpler to use, in that only those timing parameters which are appropriate for a dedicated sample clock are presented to the user. Thus, compared to the prior art, front panels of the present invention are free from much of the clutter that the prior art methods entail. The fact that only parameters which are germane to the selected type are presented may eliminate or substantially reduce the chance of erroneous use of parameters superfluous to the task at hand.

Figure 4C:
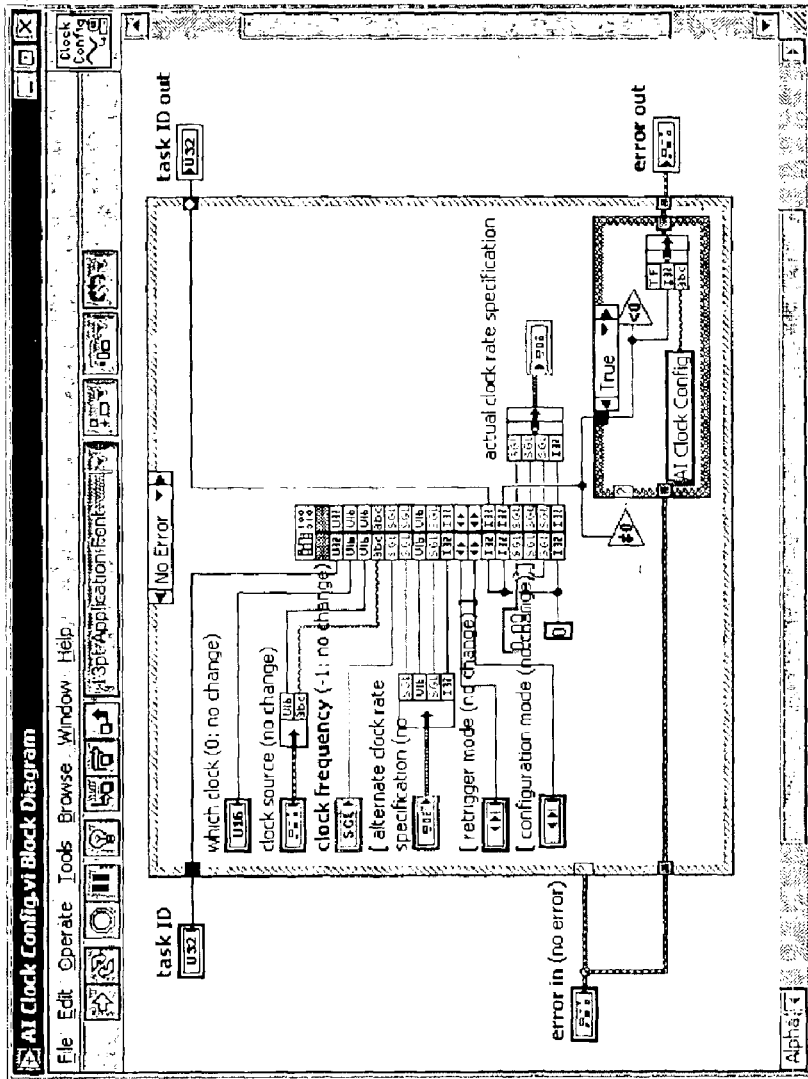

FIG. 8B illustrates a block diagram which graphically represents the functionality of the timing node 702 in accordance with the selected timing type, "Dedicated Sample Clock". As FIG. 8B shows, compared to the prior art block diagram of FIG. 4C, the block diagram of FIG. 8B is dramatically simpler, and thus more easily understood by the user.

Figure 9A:
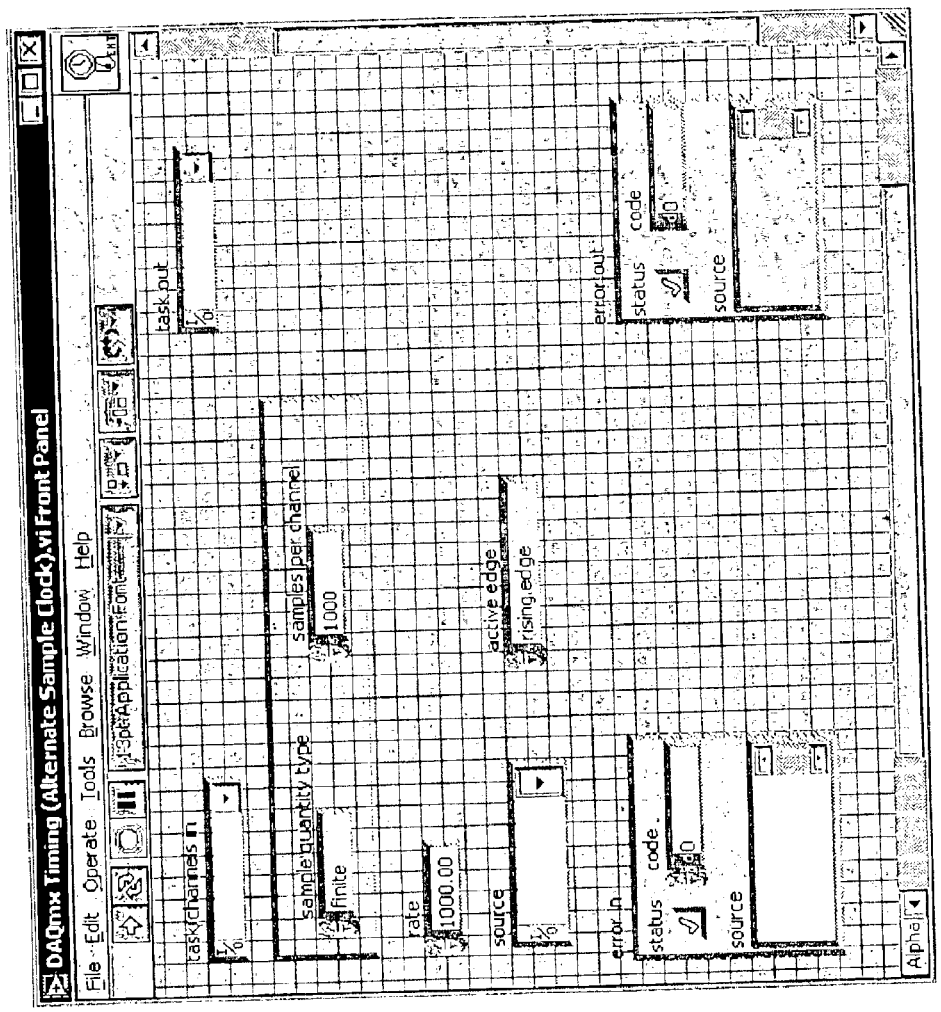
FIGS. 9A and 9B illustrate another exemplary front panel and block diagram for the timing node of FIGS. 7A–7C, according to one embodiment.
Figure 9B:
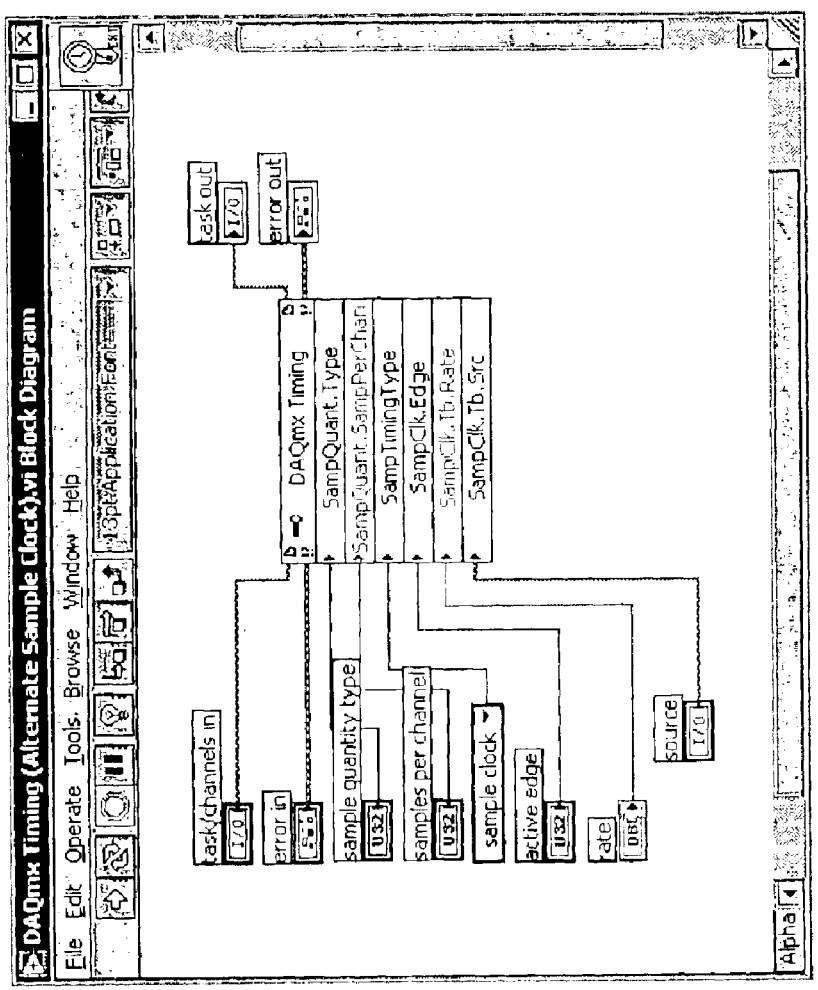

FIGS. 9A–9B—Underlying Structure of Timing Node of Type: Alternate Sample Clock

FIGS. 9A and 9B respectively illustrate a front panel and block diagram for the timing node of FIGS. 7A–7C, but where the selected type is "Alternate Sample Clock", according to one embodiment. As FIG. 9A shows, the front panel presents parameters corresponding to the timing type "Alternate Sample Clock", and, compared to the prior art front panel of FIG. 4B, which includes the superset of timing parameters for all timing types, is a much cleaner presentation of timing parameters, in that only those timing parameters which are appropriate for the alternate sample clock are presented to the user. Thus, as mentioned above, compared to the prior art, front panels of the present invention are free from much of the clutter of front panels of prior art methods.

FIG. 9B illustrates a block diagram which graphically represents the functionality of the timing node 702 in accordance with the selected timing type, "Alternate Sample Clock". As FIG. 9B shows, similar to the block diagram of FIG. 8B, the block diagram of FIG. 9B is dramatically simpler than the prior art block diagram of FIG. 4C, containing less than half the number of parameters of the prior art block diagram. The fact that only the parameters which are actually used are shown in the block diagram (for the selected type) may substantially improve the usability of the block diagram for the user.

Figure 10:
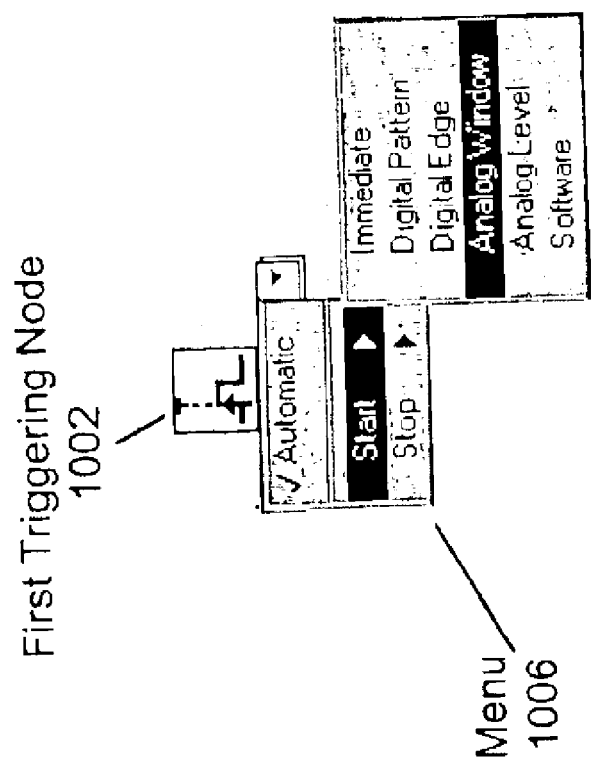
FIG. 10 illustrates selection of a triggering type for a trigger node, according to one embodiment.

FIG. 10—Typing a Triggering Node

FIG. 10 illustrates the presentation and selection of triggering types for a triggering node 1002, according to one embodiment. Note that in this illustration, the graphical program is not shown, but may be assumed to be present contextually. In one embodiment, the triggering node may have been selected from a palette, and optionally connected to function nodes in the graphical program, as was illustrated in FIGS. 7A and 7B regarding the timing node.

As FIG. 10 shows, in this embodiment, a first pop-up menu 1006 is displayed, e.g., in response to user input, that presents two high-level triggering type options, specifically, Start and Stop, which denote the two general use cases for triggers. In this example, the user has selected the "Start" menu item, invoking presentation of a second pop-up menu, also referred to as a cascade menu. The second pop-up menu presents a plurality of specific trigger types appropriate for Start triggers, including, but not limited to, Immediate, Digital Pattern, Digital Edge, Analog Window, Analog Level, and Software, which denote trigger types for the Start trigger. As may be seen, in this example, the triggering type Analog Window has been selected, thus, the triggering node will be replaced with, or configured to be, an Analog Window based Start triggering node, effectively typing the trigger node for the desired triggering functionality. Example screen shots of a front panel and block diagram for the typed triggering node are shown in FIGS. 11A and 11B, and described below.

Figure 4D:
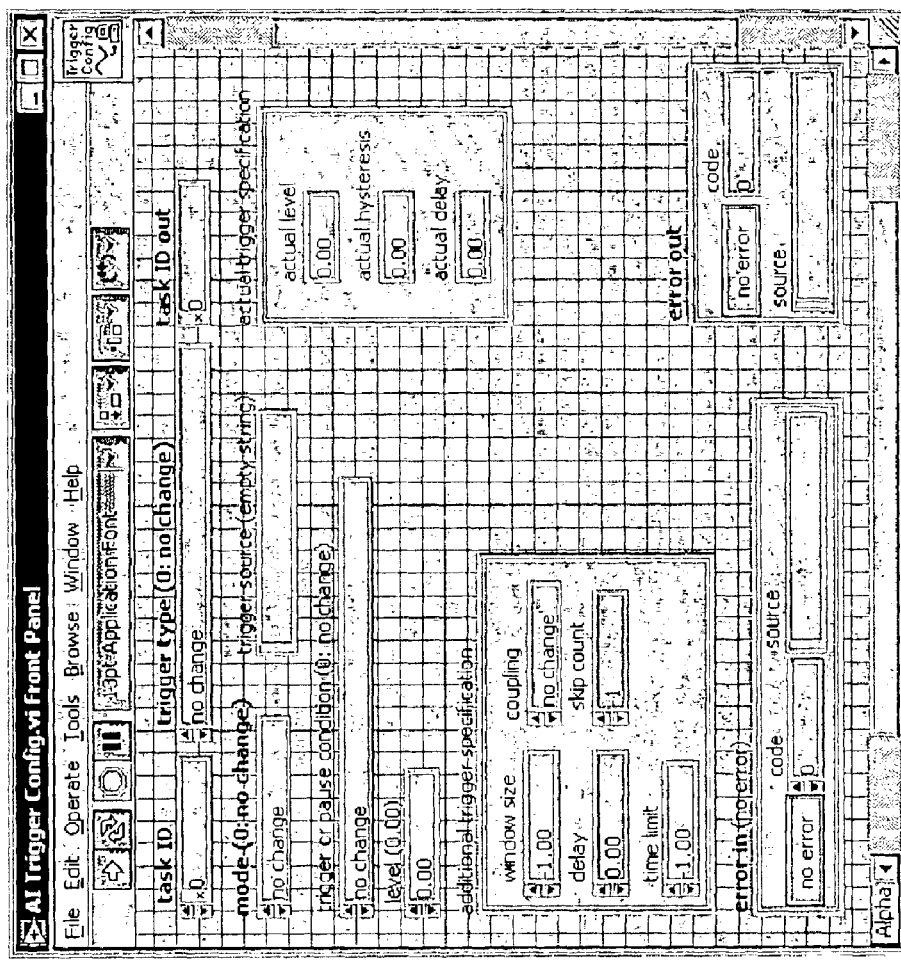
Figure 11A:
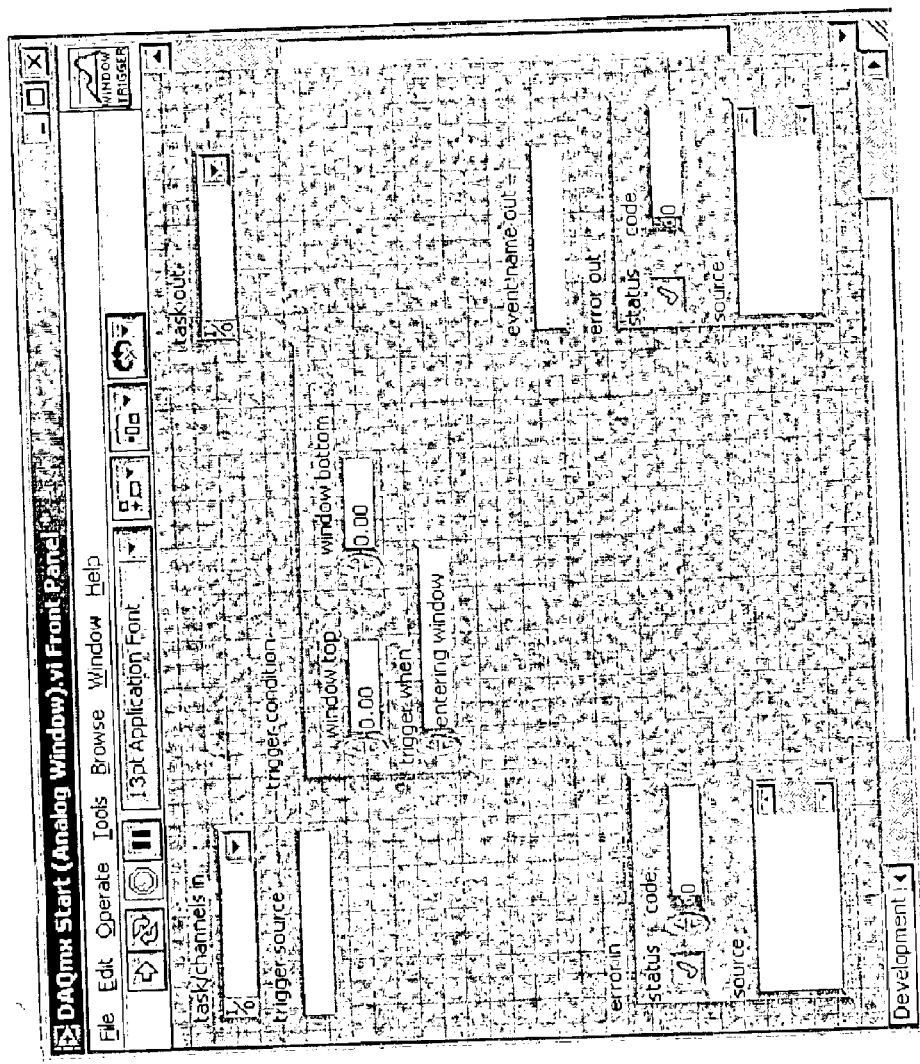
FIGS. 11A and 11B illustrate an exemplary front panel and block diagram for the triggering node of FIG. 10, according to one embodiment.
Figure 11B:
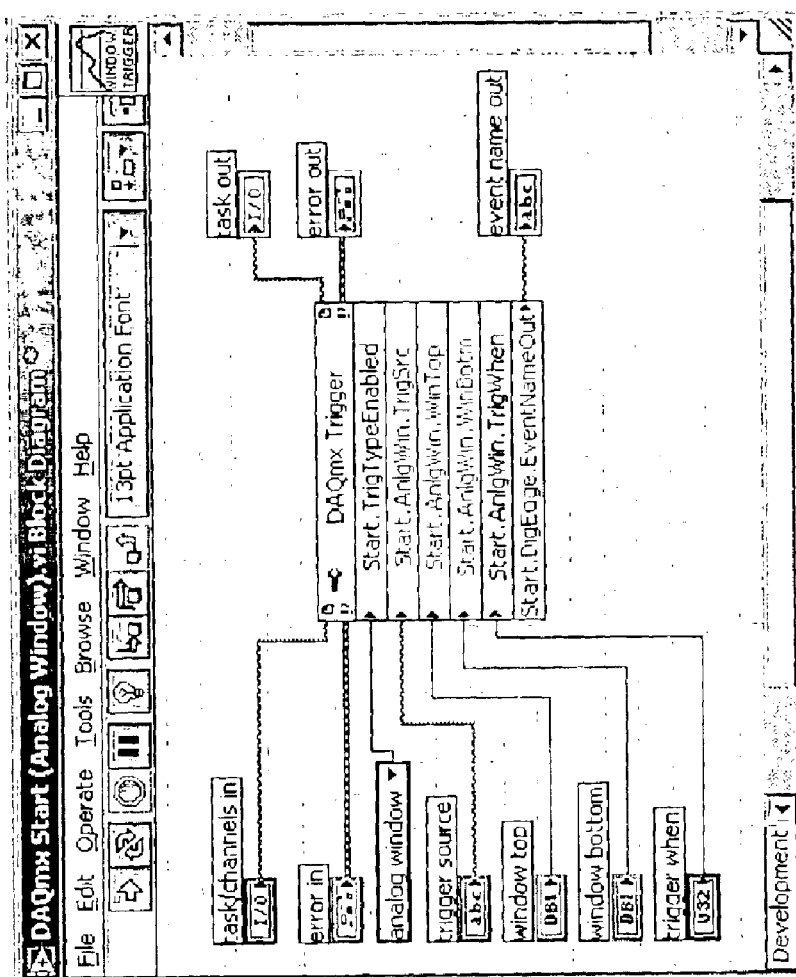

FIGS. 11A–11B—Underlying Structure of Triggering Node of Type: Start, Analog Window FIGS. 11A and 11B respectively illustrate a front panel and block diagram for the triggering node of FIG. 10, according to one embodiment. As FIG. 11A shows, the front panel presents parameters corresponding to the triggering type "Start, Analog Window". Comparing the front panel of FIG. 11A to the prior art front panel of FIG. 4D, which includes the superset of triggering parameters for all triggering types, the front panel of FIG. 11A is clearly much simpler to use, in that only those triggering parameters which are appropriate for an Analog Window based Start trigger are presented to the user. Thus, compared to the prior art, front panels of the present invention are free from much of the clutter that the prior art methods entail. As mentioned above, the fact that only parameters which are germane to the selected type are presented to the user may eliminate or substantially reduce the chance of erroneous use of parameters superfluous to the task.

Figure 4E:
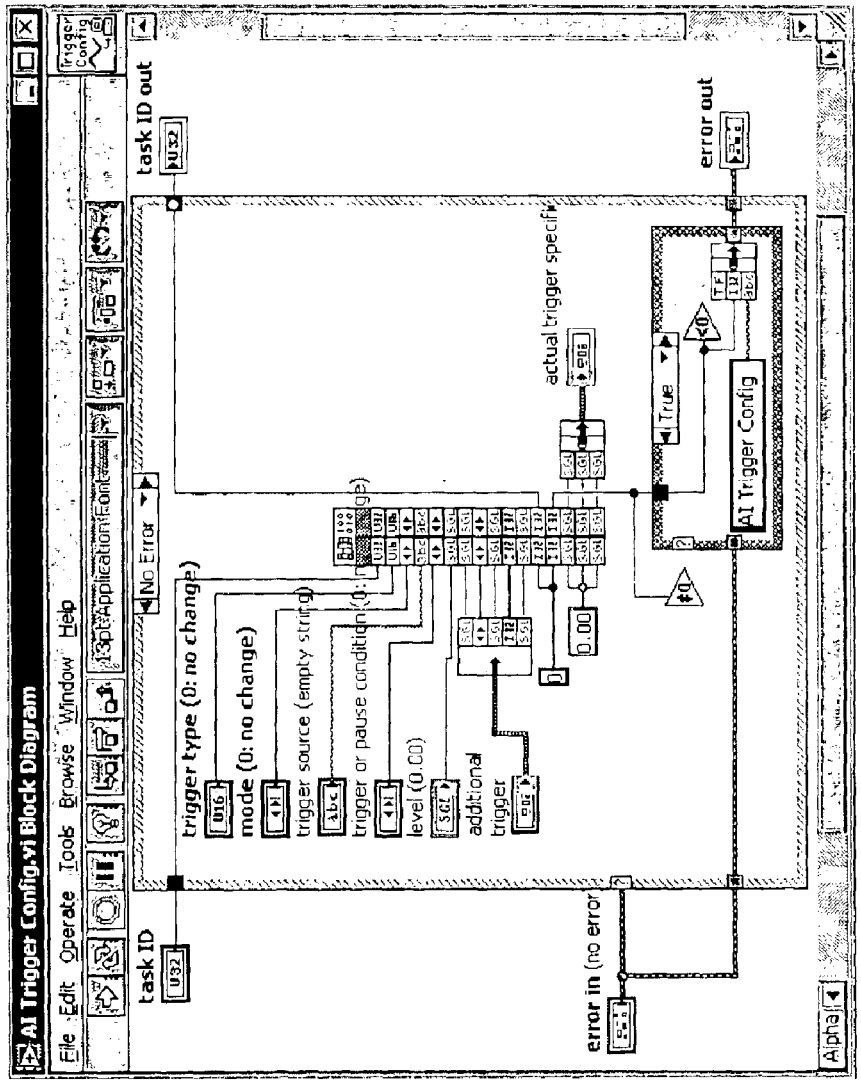

FIG. 11B illustrates a block diagram which graphically represents the functionality of the triggering node 1002 in accordance with the selected triggering type, "Start, Analog Window". As FIG. 11B shows, compared to the prior art block diagram of FIG. 4E, the block diagram of FIG. 11B is substantially simpler, and thus may be more understandable to the user.

Figure 12A:
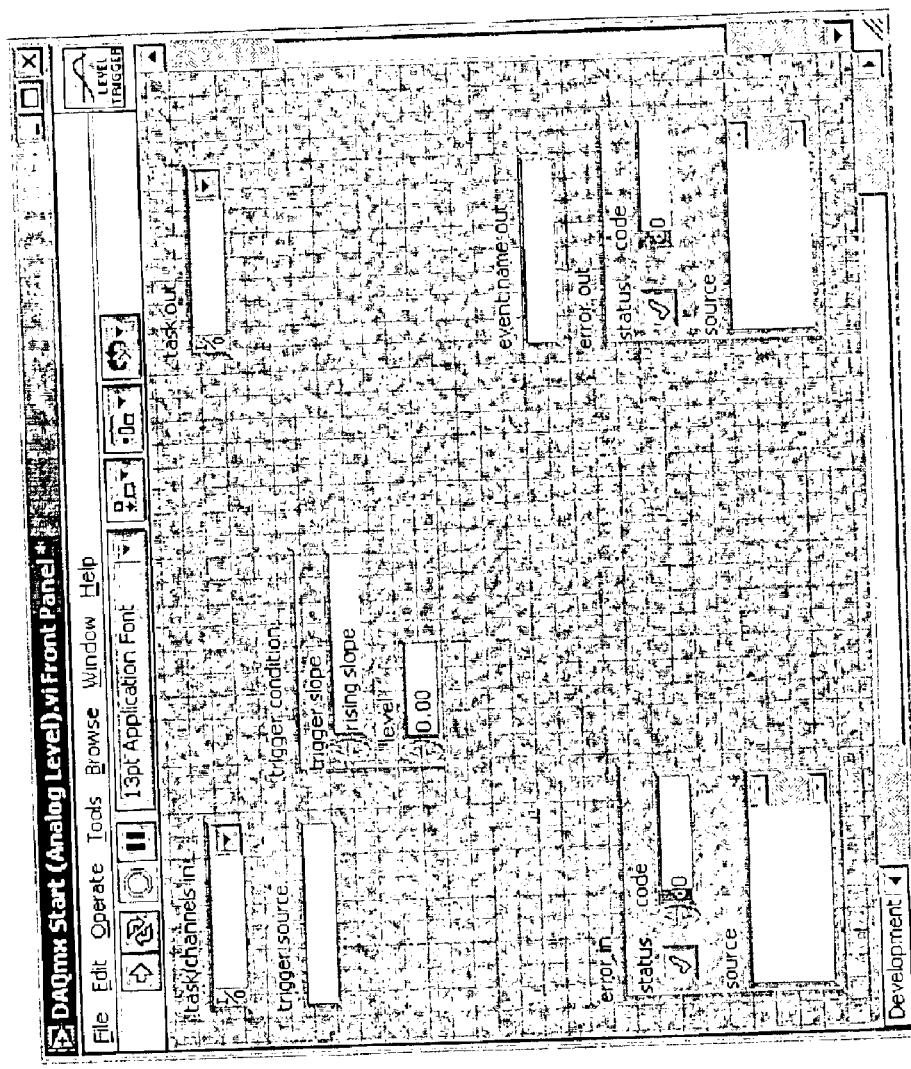
FIGS. 12A and 12B illustrate another exemplary front panel and block diagram for the timing node of FIG. 10, according to one embodiment.
Figure 12B:
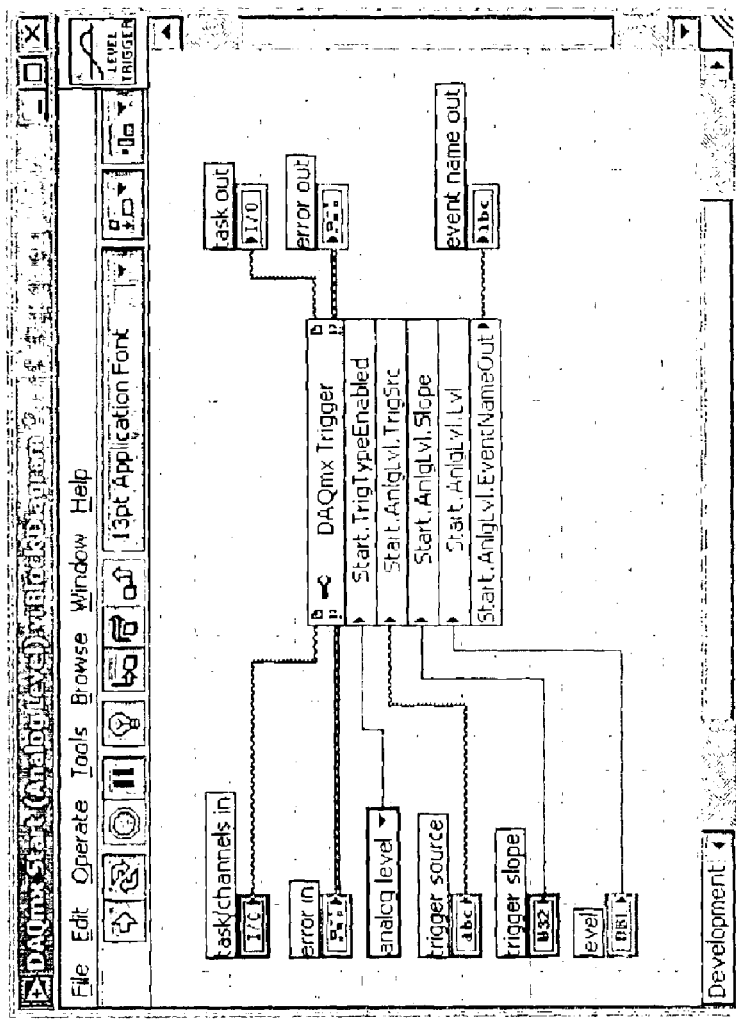

FIGS. 12A–12B—Underlying Structure of Triggering Node of Type: Start, Analog Level FIGS. 12A and 12B respectively illustrate a front panel and block diagram for the triggering node of FIG. 10, but where the selected type is "Start, Analog Level", according to one embodiment. In other words, the triggering occurs when an analog level reaches or exceeds some specified threshold value. As FIG. 12A shows, the front panel presents parameters corresponding to the triggering type "Start, Analog Level", and, compared to the prior art front panel of FIG. 4E, which includes the superset of triggering parameters for all triggering types, is a much cleaner presentation of triggering parameters, in that only those triggering parameters which are appropriate for the analog level based start trigger are presented to the user. Thus, as mentioned above, compared to the prior art, front panels of the present invention are free from much of the clutter of front panels of prior art methods.

FIG. 12B illustrates a block diagram which graphically represents the functionality of the triggering node 1002 in accordance with the selected triggering type, "Start, Analog Level". As FIG. 12B shows, similar to the block diagram of FIG. 11B, the block diagram of FIG. 12B is much simpler than the prior art block diagram of FIG. 4E, containing less than half the number of parameters of the prior art block diagram.

Thus, various embodiments of the systems and methods described above may facilitate the specification of timing and/or triggering in a graphical program with increased flexibility and substantially improved ease of use, compared to prior art methods. More specifically, graphical timing and triggering nodes are described which may easily be typed after inclusion in the graphical program, resulting in a corresponding change in the underlying functionality of the node. The parameters associated with the typed node are limited to those appropriate to the selected type, thereby substantially simplifying timing and triggering configuration for the user. Additionally, in some embodiments, the node may be re-typed as desired, where each type selection results in a corresponding change in the underlying functionality of the node.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A computer-implemented method for specifying timing in a graphical program, wherein the method for specifying timing operates in a computer including a memory, a display and a user input device, the method comprising:

displaying on the display a first timing node in the graphical program;

displaying on the display a plurality of timing type options for the first timing node;

receiving user input specifying a timing type from the plurality of timing type options;

determining a second timing node based on the user input specifying the timing type; and displaying the second timing node on the display in the graphical program in place of the first timing node, wherein the second timing node is operable to configure timing functionality for the graphical program in accordance with the timing type.

2. The method of claim 1, wherein the first timing node is polymorphic.

3. The method of claim 1, further comprising:

connecting the first timing node to one or more function nodes in the graphical program prior to said displaying on the display a plurality of timing type options for the first timing node, wherein the first timing node is operable to configure timing functionality for the one or more function nodes.

4. The method of claim 1, wherein the second timing node is operable to be connected to one or more function nodes in the graphical program to configure timing functionality in the graphical program in accordance with the specified timing type.

5. The method of claim 4, further comprising:
receiving user input to the graphical program connecting the second timing node to one or more function nodes in the graphical program, wherein the second timing node is operable to configure timing functionality for the one or more function nodes.

6. The method of claim 1, wherein the second timing node comprises:
a second timing node icon; and
a block diagram, comprising a graphical representation of the implementation of timing configuration in accordance with the specified timing type.

7. The method of claim 1, wherein the second timing node comprises:
a front panel comprising one or more controls and/or indicators for interactively setting and displaying one or more timing parameters during graphical program execution in accordance with the specified timing type.

8. The method of claim 1, wherein the second timing node comprises:
a second timing node icon; and
program instructions and/or data structures for implementing timing configuration in accordance with the specified timing type.

9. The method of claim 1, wherein the second timing node comprises:
a second timing node icon; and
a front panel comprising one or more controls and/or indicators for interactively setting and displaying one or more timing parameters during graphical program execution in accordance with the specified timing type.

10. The method of claim 1, wherein the second timing node comprises:
a second timing node icon; and
a graphical user interface comprising one or more controls and/or indicators for enabling a user to set and/or display one or more timing parameters prior to graphical program execution in accordance with the specified timing type.

11. The method of claim 1, wherein the second timing node comprises one or more of:
a second timing node icon;
a front panel, comprising one or more controls and/or indicators for interactively setting and displaying one or more timing parameters during graphical program execution in accordance with the specified timing type; and
a block diagram, comprising a graphical representation of the implementation of timing configuration in accordance with the specified timing type.

12. The method of claim 11, further comprising:
displaying the front panel on the display; and
receiving user input to the front panel specifying a value for at least one of the one or more timing parameters;
wherein the second timing node is operable to configure timing functionality in the graphical program in accordance with the one or more timing parameters.

13. The method of claim 11, further comprising:
displaying the block diagram on the display.

14. The method of claim 1, wherein the graphical program is executable to perform a measurement task, and wherein the second timing node is operable to configure timing functionality in the graphical program for performance of the measurement task.

15. The method of claim 14, wherein the measurement task comprises one or more of:
a data acquisition task; and
a signal generation task.

16. The method of claim 1, wherein said displaying on the display the first timing node in the graphical program comprises:
displaying on the display the first timing node in the graphical program in response to user input specifying the first timing node.

17. The method of claim 16, wherein said user input specifying the first timing node comprises:
the user dragging and dropping the first timing node from a palette to the graphical program.

18. The method of claim 1, further comprising:
executing the graphical program to perform a task, wherein the second timing node executes to configure timing functionality in the graphical program for performance of the task.

19. The method of claim 1,
wherein the first timing node has a default timing type; and
wherein the first timing node comprises one or more of:
a default front panel, comprising one or more controls and/or indicators for interactively setting and displaying one or more timing parameters during graphical program execution in accordance with the default timing type; and
a default block diagram, comprising a graphical representation of the implementation of timing configuration in accordance with the default timing type.

20. A computer-implemented method for specifying timing in a first graphical program, wherein the method for specifying timing operates in a computer including a memory, display and a user input device, the method comprising:
displaying on the display a timing node in the first graphical program;
displaying on the display a plurality of timing type options for the timing node;
receiving user input specifying a timing type from the plurality of timing type options; and
configuring the timing node according to the timing type, wherein after said configuring the timing node is operable to configure timing functionality for the first graphical program in accordance with the timing type.

21. The method of claim 20, wherein said configuring the timing node comprises:
determining a timing graphical program in response to said user input specifying the timing type, wherein the timing graphical program corresponds to the timing type; and
associating the timing graphical program with the timing node;
wherein during execution of the timing node, the timing graphical program executes to configure timing functionality for the first graphical program in accordance with the timing type.

22. The method of claim 20, wherein said configuring the timing node comprises:
associating program instructions and/or data structures with the timing node, wherein the program instructions and/or data structures are executable to configure timing functionality for the first graphical program in accordance with the timing type;

wherein during execution of the timing node, the program instructions and/or data structures execute to configure timing functionality for the first graphical program in accordance with the timing type.

23. The method of claim 20, wherein said configuring the timing node comprises:

creating program instructions and/or data structures in the memory which are executable to configure timing functionality for the first graphical program in accordance with the timing type; and associating the program instructions and/or data structures with the timing node wherein during execution of the timing node, the program instructions and/or data structures execute to configure timing functionality for the first graphical program in accordance with the timing type.

24. The method of claim 20, wherein said configuring the timing node comprises:

determining a front panel in response to said user input specifying the timing type, wherein the front panel corresponds to the timing type; and associating the front panel with the timing node;

wherein the front panel comprises one or more controls and/or indicators for interactively setting and displaying one or more timing parameters during graphical program execution in accordance with the specified timing type; and wherein during execution of the timing node, the front panel is useable to interactively configure timing functionality for the first graphical program in accordance with the one or more timing parameters.

25. The method of claim 20, wherein the timing node includes an icon; and wherein said configuring the timing node comprises changing the appearance of the timing node icon to visually indicate one or more of the timing type or the timing functionality.

26. The method of claim 20, further comprising:

executing the graphical program to perform a task, wherein the timing node executes to configure timing functionality in the graphical program for performance of the measurement task.

27. A computer-implemented method for specifying timing in a graphical program, wherein the method for specifying timing operates in a computer including a memory, a display, and a user input device, the method comprising:

displaying on the display a first polymorphic timing node in the graphical program;

displaying on the display a plurality of timing type options for the first polymorphic timing node;

receiving user input specifying one of the plurality of timing type options;

determining a front panel and a block diagram in response to said user input specifying one of the plurality of timing type options, wherein the front panel and block diagram correspond to the specified timing type, and wherein the front panel and block diagram are operable to configure timing functionality for the graphical program in accordance with the specified timing type; and including the front panel and block diagram in the graphical program, wherein during execution of the graphical program the front panel and block diagram are executable to configure timing functionality for the graphical program in accordance with the specified timing type.

28. The method of claim 27, further comprising:

in response to said determining, replacing the first polymorphic timing node in the graphical program with a second timing node corresponding to the front panel and block diagram, wherein the first polymorphic timing node and the second timing node have a name and/or an icon in common.

29. The method of claim 28, wherein the second timing node is a polymorphic timing node.

30. The method of claim 28, wherein the second timing node is operable to be connected to one or more function nodes in the graphical program to configure timing functionality in the graphical program in accordance with the specified timing type.

31. The method of claim 30, further comprising:

receiving user input to the graphical program connecting the second timing node to one or more function nodes in the graphical program, wherein the second timing node is operable to configure timing functionality for the one or more function nodes.

32. The method of claim 28, executing the graphical program to perform a task, wherein the second timing node executes to configure timing functionality in the graphical program for performance of the task.

33. The method of claim 27, wherein the front panel comprises one or more controls and/or indicators for interactively setting and displaying one or more timing parameters during graphical program execution in accordance with the specified timing type; and wherein the block diagram comprises a graphical representation of the implementation of timing configuration in accordance with the specified timing type.

34. The method of claim 27, further comprising:

connecting the first polymorphic timing node to one or more function nodes in the graphical program prior to said displaying on the display a plurality of timing type options for the first polymorphic timing node, wherein the first polymorphic timing node is operable to configure timing functionality for the one or more function nodes.

35. A computer-implemented method for specifying timing in a graphical program, wherein the method for specifying timing operates in a computer including a display and a user input device, the method comprising:

displaying on the display a first polymorphic timing node in the graphical program;

displaying on the display a plurality of timing type options for the first polymorphic timing node;

receiving user input specifying one of the plurality of timing type options; and determining a second timing node in response to said user input specifying one of the plurality of timing type options, wherein the second timing node corresponds to the specified timing type, and wherein the second timing node is operable to configure timing functionality for the graphical program in accordance with the specified timing type.

36. The method of claim 35, further comprising:

including the second timing node in the graphical program in place of the first polymorphic timing node, wherein during execution of the graphical program the second timing node executes to configure timing functionality for the graphical program in accordance with the specified timing type.

37. A computer-implemented method for specifying timing in a first graphical program, wherein the method for specifying timing operates in a computer including a display and a user input device, the method comprising:

displaying on the display a first timing node in the first graphical program;

displaying on the display a plurality of timing type options for the first timing node;

receiving user input specifying one of the plurality of timing type options; and determining a timing graphical program in response to third user input specifying one of the plurality of timing type options, wherein the timing graphical program corresponds to the specified timing type, and wherein the timing graphical program is executable to configure timing functionality for the first graphical program in accordance with the specified timing type.

38. The method of claim 37, further comprising:

associating the timing graphical program with the first timing node in response to said determining, wherein during execution of the first graphical program, the timing graphical program executes to configure timing functionality for the first graphical program in accordance with the specified timing type.

39. A computer-implemented method for specifying timing in a graphical program, wherein the method for specifying timing operates in a computer including a memory, a display and a user input device, the method comprising:

displaying on the display a plurality of timing type options for a timing node to be included in the graphical program;

receiving user input specifying a timing type from the plurality of timing type options;

determining the timing node based on the user input specifying the timing type; and displaying the timing node on the display in the graphical program, wherein the timing node is operable to configure timing functionality for the graphical program in accordance with the timing type.

40. The method of claim 39, further comprising:

displaying on the display a first timing node in the graphical program prior to said displaying on the display the plurality of timing type options; and receiving user input selecting the first timing node for configuration;

wherein said displaying on the display the plurality of timing type options is performed in response to said user input selecting the first timing node for configuration.

41. The method of claim 40, further comprising:

connecting the first timing node to one or more function nodes in the graphical program prior to said displaying on the display a plurality of timing type options for the timing node, wherein the first timing node is operable to configure timing functionality for the one or more function nodes.

42. The method of claim 39, further comprising:

displaying on the display an icon which represents a timing function; and receiving user input selecting the icon for configuration;

wherein said displaying on the display the plurality of timing type options is performed in response to said user input selecting the icon for configuration.

43. The method of claim 42, further comprising:

connecting the icon to one or more function nodes in the graphical program prior to said displaying on the display a plurality of timing type options for the timing node, wherein the icon is operable to function as a place-holder for the timing node.

44. The method of claim 39, further comprising:

wherein said displaying on the display the plurality of timing type options comprises displaying a graphical user interface (GUI) comprising the plurality of timing type options.

45. The method of claim 44, wherein the GUI is a menu.

46. A carrier medium which stores program instructions for specifying timing in a graphical program, wherein the program instructions are executable to perform:

displaying on the display a first timing node in the graphical program;

displaying on the display a plurality of timing type options for the first timing node;

receiving user input specifying a timing type from the plurality of timing type options;

determining a second timing node based on the user input specifying the timing type; and displaying the second timing node on the display in the graphical program in place of the first timing node, wherein the second timing node is operable to configure timing functionality for the graphical program in accordance with the timing type.

47. A system for specifying timing in a graphical program, the system comprising:

a computer system, comprising:

a memory which is operable to store graphical programming software;

a processor coupled to said memory; and a display coupled to said processor and to said memory which is operable to display the graphical program;

wherein said graphical programming software is executable by said processor to perform:

displaying on the display a first timing node in the graphical program;

displaying on the display a plurality of timing type options for the first timing node;

receiving user input specifying a timing type from the plurality of timing type options;

determining a second timing node based on the user input specifying the timing type; and displaying the second timing node on the display in the graphical program in place of the first timing node, wherein the second timing node is operable to configure timing functionality for the graphical program in accordance with the timing type.

48. A system for specifying timing in a graphical program, the system comprising:

means for displaying on the display a first timing node in the graphical program;

means for displaying on the display a plurality of timing type options for the first timing node;

means for receiving user input specifying a timing type from the plurality of timing type options;

means for determining a second timing node based on the user input specifying the timing type; and means for displaying the second timing node on the display in the graphical program in place of the first timing node, wherein the second timing node is operable to configure timing functionality for the graphical program in accordance with the timing type.

49. A computer-implemented method for specifying triggering in a graphical program, wherein the method for specifying triggering operates in a computer including a memory, a display and a user input device, the method comprising:

displaying on the display a first triggering node in the graphical program;

displaying on the display a plurality of triggering type options for the first triggering node;

receiving user input specifying a triggering type from the plurality of triggering type options;

determining a second triggering node based on the user input specifying the triggering type; and displaying the second triggering node on the display in the graphical program in place of the first triggering node, wherein the second triggering node is operable to configure triggering functionality for the graphical program in accordance with the triggering type.

50. The method of claim 49, wherein the first triggering node is polymorphic.

51. The method of claim 49, further comprising:

connecting the first triggering node to one or more function nodes in the graphical program prior to said displaying on the display a plurality of triggering type options for the first triggering node, wherein the first triggering node is operable to configure triggering functionality for the one or more function nodes.

52. The method of claim 49, wherein the second triggering node is operable to be connected to one or more function nodes in the graphical program to configure triggering functionality in the graphical program in accordance with the specified triggering type.

53. The method of claim 52, further comprising:

receiving user input to the graphical program connecting the second triggering node to one or more function nodes in the graphical program, wherein the second triggering node is operable to configure triggering functionality for the one or more function nodes.

54. The method of claim 49, wherein the second triggering node comprises:

a second triggering node icon; and a block diagram, comprising a graphical representation of the implementation of triggering configuration in accordance with the specified triggering type.

55. The method of claim 54, wherein the second triggering node further comprises:

a front panel comprising one or more controls and/or indicators for interactively setting and displaying one or more triggering parameters during graphical program execution in accordance with the specified triggering type.

56. The method of claim 49, wherein the second triggering node comprises:

a second triggering node icon; and program instructions and/or data structures for implementing triggering configuration in accordance with the specified triggering type.

57. The method of claim 49, wherein the second triggering node comprises:

a second triggering node icon; and a front panel comprising one or more controls and/or indicators for interactively setting and displaying one or more triggering parameters during graphical program execution in accordance with the specified triggering type.

58. The method of claim 49, wherein the second triggering node comprises:

a second triggering node icon; and a graphical user interface comprising one or more controls and/or indicators for enabling a user to set and/or display one or more triggering parameters prior to graphical program execution in accordance with the specified triggering type.

59. The method of claim 49, wherein the second triggering node comprises one or more of:

a second triggering node icon, a front panel, comprising one or more controls and/or indicators for interactively setting and displaying one or more triggering parameters during graphical program execution in accordance with the specified triggering type; and a block diagram, comprising a graphical representation of the implementation of triggering configuration in accordance with the specified triggering type.

60. The method of claim 59, further comprising:

displaying the front panel on the display; and receiving user input to the front panel specifying a value for at least one of the one or more triggering parameters;

wherein the second triggering node is operable to configure triggering functionality in the graphical program in accordance with the one or more triggering parameters.

61. The method of claim 59, further comprising:

displaying the block diagram on the display.

62. The method of claim 49, wherein the graphical program is executable to perform a measurement task, and wherein the second triggering node is operable to configure triggering functionality in the graphical program for performance of the measurement task.

63. The method of claim 62, wherein the measurement task comprises one or more of:

a data acquisition task; and a signal generation task.

64. The method of claim 49, wherein said displaying on the display the first triggering node in the graphical program comprises:

displaying on the display the first triggering node in the graphical program in response to user input specifying the first triggering node.

65. The method of claim 64, wherein said user input specifying the first triggering node comprises:

the user dragging and dropping the first triggering node from a palette to the graphical program.

66. The method of claim 49, further comprising:

executing the graphical program to perform a task, wherein the second triggering node executes to configure triggering functionality in the graphical program for performance of the task.

67. The method of claim 49, wherein the first triggering node has a default triggering type; and wherein the first triggering node comprises one or more of:

a default front panel, comprising one or more controls and/or indicators for interactively setting and displaying one or more triggering parameters during graphical program execution in accordance with the default triggering type; and a default block diagram, comprising a graphical representation of the implementation of triggering configuration in accordance with the default triggering type.

68. A computer-implemented method for specifying triggering in a first graphical program, wherein the method for specifying triggering operates in a computer including a memory, display and a user input device, the method comprising:

displaying on the display a triggering node in the first graphical program;

displaying on the display a plurality of triggering type options for the triggering node;

receiving user input specifying a triggering type from the plurality of triggering type options; and configuring the triggering node according to the triggering type, wherein after said configuring the triggering node is operable to configure triggering functionality for the first graphical program in accordance with the triggering type.

69. The method of claim 68, wherein said configuring the triggering node comprises:

determining a triggering graphical program in response to said user input specifying the triggering type, wherein the triggering graphical program corresponds to the triggering type; and associating the triggering graphical program with the triggering node;

wherein during execution of the triggering node, the triggering graphical program executes to configure triggering functionality for the first graphical program in accordance with the triggering type.

70. The method of claim 68, wherein said configuring the triggering node comprises:

associating program instructions and/or data structures with the triggering node, wherein the program instructions and/or data structures are executable to configure triggering functionality for the first graphical program in accordance with the triggering type;

wherein during execution of the triggering node, the program instructions and/or data structures execute to configure triggering functionality for the first graphical program in accordance with the triggering type.

71. The method of claim 68, wherein said configuring the triggering node comprises:

creating program instructions and/or data structures in the memory which are executable to configure triggering functionality for the first graphical program in accordance with the triggering type; and associating the program instructions and/or data structures with the triggering node wherein during execution of the triggering node, the program instructions and/or data structures execute to configure triggering functionality for the first graphical program in accordance with the triggering type.

72. The method of claim 68, wherein said configuring the triggering node comprises:

determining a front panel in response to said user input specifying the triggering type, wherein the front panel corresponds to the triggering type; and associating the front panel with the triggering node;

wherein the front panel comprises one or more controls and/or indicators for interactively setting and displaying one or more triggering parameters during graphical program execution in accordance with the specified triggering type; and wherein during execution of the triggering node, the front panel is useable to interactively configure triggering functionality for the first graphical program in accordance with the one or more triggering parameters.

73. The method of claim 68, wherein the triggering node includes an icon; and wherein said configuring the triggering node comprises changing the appearance of the triggering node icon to visually indicate one or more of the triggering type or the triggering functionality.

74. The method of claim 68, further comprising:

executing the graphical program to perform a task, wherein the triggering node executes to configure triggering functionality in the graphical program for performance of the measurement task.

75. A computer-implemented method for specifying triggering in a graphical program, wherein the method for specifying triggering operates in a computer including a memory, a display, and a user input device, the method comprising:

displaying on the display a first polymorphic triggering node in the graphical program;

displaying on the display a plurality of triggering type options for the first polymorphic triggering node;

receiving user input specifying one of the plurality of triggering type options;

determining a front panel and a block diagram in response to said user input specifying one of the plurality of triggering type options, wherein the front panel and block diagram correspond to the specified triggering type, and wherein the front panel and block diagram are operable to configure triggering functionality for the graphical program in accordance with the specified triggering type; and including the front panel and block diagram in the graphical program, wherein during execution of the graphical program the front panel and block diagram are executable to configure triggering functionality for the graphical program in accordance with the specified triggering type.

76. The method of claim 75, further comprising:

in response to said determining, replacing the first polymorphic triggering node in the graphical program with a second triggering node corresponding to the front panel and block diagram, wherein the first polymorphic triggering node and the second triggering node have a name and/or an icon in common.

77. The method of claim 76, wherein the second triggering node is a polymorphic triggering node.

78. The method of claim 77, wherein the second triggering node is operable to be connected to one or more function nodes in the graphical program to configure triggering functionality in the graphical program in accordance with the specified triggering type.

79. The method of claim 78, further comprising:

receiving user input to the graphical program connecting the second triggering node to one or more function nodes in the graphical program, wherein the second triggering node is operable to configure triggering functionality for the one or more function nodes.

80. The method of claim 76, executing the graphical program to perform a task, wherein the second triggering node executes to configure triggering functionality in the graphical program for performance of the task.

81. The method of claim 75, wherein the front panel comprises one or more controls and/or indicators for interactively setting and displaying one or more triggering parameters during graphical program execution in accordance with the specified triggering type; and wherein the block diagram comprises a graphical representation of the implementation of triggering configuration in accordance with the specified triggering type.

82. The method of claim 75, further comprising:

connecting the first polymorphic triggering node to one or more function nodes in the graphical program prior to said displaying on the display a plurality of triggering type options for the first polymorphic triggering node, wherein the first polymorphic triggering node is operable to configure triggering functionality for the one or more function nodes.

83. A computer-implemented method for specifying triggering in a graphical program, wherein the method for specifying triggering operates in a computer including a display and a user input device, the method comprising:

displaying on the display a first polymorphic triggering node in the graphical program;

displaying on the display a plurality of triggering type options for the first polymorphic triggering node;

receiving user input specifying one of the plurality of triggering type options; and determining a second triggering node in response to said user input specifying one of the plurality of triggering type options, wherein the second triggering node corresponds to the specified triggering type, and wherein the second triggering node is operable to configure triggering functionality for the graphical program in accordance with the specified triggering type.

84. The method of claim 83, further comprising:

including the second triggering node in the graphical program in place of the first polymorphic triggering node, wherein during execution of the graphical program the second triggering node executes to configure triggering functionality for the graphical program in accordance with the specified triggering type.

85. A computer-implemented method for specifying triggering in a first graphical program, wherein the method for specifying triggering operates in a computer including a display and a user input device, the method comprising:

displaying on the display a first triggering node in the first graphical program;

displaying on the display a plurality of triggering type options for the first triggering node;

receiving user input specifying one of the plurality of triggering type options; and determining a triggering graphical program in response to third user input specifying one of the plurality of triggering type options, wherein the triggering graphical program corresponds to the specified triggering type, and wherein the triggering graphical program is executable to configure triggering functionality for the first graphical program in accordance with the specified triggering type.

86. The method of claim 85, further comprising:

associating the triggering graphical program with the first triggering node in response to said determining, wherein during execution of the first graphical program, the triggering graphical program executes to configure triggering functionality for the first graphical program in accordance with the specified triggering type.

87. A computer-implemented method for specifying triggering in a graphical program, wherein the method for specifying triggering operates in a computer including a memory, a display and a user input device, the method comprising:

displaying on the display a plurality of triggering type options for a triggering node to be included in the graphical program;

receiving user input specifying a triggering type from the plurality of triggering type options;

determining the triggering node based on the user input specifying the triggering type; and displaying the triggering node on the display in the graphical program, wherein the triggering node is operable to configure triggering functionality for the graphical program in accordance with the triggering type.

88. The method of claim 87, further comprising:

displaying on the display a first triggering node in the graphical program prior to said displaying on the display the plurality of triggering type options; and receiving user input selecting the first triggering node for configuration;

wherein said displaying on the display the plurality of triggering type options is performed in response to said user input selecting the first triggering node for configuration.

89. The method of claim 88, further comprising:

connecting the first triggering node to one or more function nodes in the graphical program prior to said displaying on the display a plurality of triggering type options for the triggering node, wherein the first triggering node is operable to configure triggering functionality for the one or more function nodes.

90. The method of claim 87, further comprising:

displaying on the display an icon which represents a triggering function; and receiving user input selecting the icon for configuration;

wherein said displaying on the display the plurality of triggering type options is performed in response to said user input selecting the icon for configuration.

91. The method of claim 90, further comprising:

connecting the icon to one or more function nodes in the graphical program prior to said displaying on the display a plurality of triggering type options for the triggering node, wherein the icon is operable to function as a place-holder for the triggering node.

92. The method of claim 87, further comprising:

wherein said displaying on the display the plurality of triggering type options comprises displaying a graphical user interface (GUI) comprising the plurality of triggering type options.

93. The method of claim 92, wherein the GUI is a menu.

94. A carrier medium which stores program instructions for specifying triggering in a graphical program, wherein the program instructions are executable to perform:

displaying on the display a first triggering node in the graphical program;

displaying on the display a plurality of triggering type options for the first triggering node;

receiving user input specifying a triggering type from the plurality of triggering type options;

determining a second triggering node based on the user input specifying the triggering type; and displaying the second triggering node on the display in the graphical program in place of the first triggering node, wherein the second triggering node is operable to configure triggering functionality for the graphical program in accordance with the triggering type.

95. A system for specifying triggering in a graphical program, the system comprising:
   a computer system, comprising:
      a memory which is operable to store graphical programming software;
      a processor coupled to said memory; and
      a display coupled to said processor and to said memory which is operable to display the graphical program;
   wherein said graphical programming software is executable by said processor to perform:
      displaying on the display a first triggering node in the graphical program;
      displaying on the display a plurality of triggering type options for the first triggering node;
      receiving user input specifying a triggering type from the plurality of triggering type options;
      determining a second triggering node based on the user input specifying the triggering type; and
      displaying the second triggering node on the display in the graphical program in place of the first triggering node, wherein the second triggering node is operable to configure triggering functionality for the graphical program in accordance with the triggering type.

96. A system for specifying triggering in a graphical program, the system comprising:
   means for displaying on the display a first triggering node in the graphical program;
   means for displaying on the display a plurality of triggering type options for the first triggering node;
   means for receiving user input specifying a triggering type from the plurality of triggering type options;
   means for determining a second triggering node based on the user input specifying the triggering type; and
   means for displaying the second triggering node on the display in the graphical program in place of the first triggering node, wherein the second triggering node is operable to configure triggering functionality for the graphical program in accordance with the triggering type.

* * * * *